(12) United States Patent
Hirose et al.

(10) Patent No.: US 11,870,218 B2
(45) Date of Patent: Jan. 9, 2024

(54) LIGHT EMISSION DEVICE

(71) Applicant: HAMAMATSU PHOTONICS K.K., Hamamatsu (JP)

(72) Inventors: Kazuyoshi Hirose, Hamamatsu (JP); Takahiro Sugiyama, Hamamatsu (JP); Yuu Takiguchi, Hamamatsu (JP); Yoshiro Nomoto, Hamamatsu (JP); Soh Uenoyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 557 days.

(21) Appl. No.: 16/972,825

(22) PCT Filed: Jun. 4, 2019

(86) PCT No.: PCT/JP2019/022143
§ 371 (c)(1),
(2) Date: Dec. 7, 2020

(87) PCT Pub. No.: WO2019/239960
PCT Pub. Date: Dec. 19, 2019

(65) Prior Publication Data
US 2021/0249842 A1  Aug. 12, 2021

(30) Foreign Application Priority Data

Jun. 11, 2018 (JP) ................ 2018-111340

(51) Int. Cl.
*H01S 5/185* (2021.01)
*H01S 5/042* (2006.01)
(Continued)

(52) U.S. Cl.
CPC .............. *H01S 5/185* (2021.01); *H01S 5/005* (2013.01); *H01S 5/04252* (2019.08);
(Continued)

(58) Field of Classification Search
CPC ...................................................... H01S 5/185
(Continued)

(56) References Cited

U.S. PATENT DOCUMENTS

2016/0248224 A1* 8/2016 Noda .................... H01S 5/185
2018/0109075 A1* 4/2018 Kurosaka ................ H01S 5/423

FOREIGN PATENT DOCUMENTS

CN        105191029 A     12/2015
WO   WO-2014/136607 A1    9/2014
(Continued)

OTHER PUBLICATIONS

International Preliminary Report on Patentability dated Dec. 24, 2020 for PCT/JP2019/022143.
(Continued)

*Primary Examiner* — Tuan N Nguyen
(74) *Attorney, Agent, or Firm* — Faegre Drinker Biddle & Reath LLP

(57) ABSTRACT

A light emission device of one embodiment reduces zero-order light included in output of an S-iPM laser. The light emission device includes a light emission unit and a phase modulation layer. The phase modulation layer has a base layer and modified refractive index regions each including modified refractive index elements. In each unit constituent region centered on a lattice point of an imaginary square lattice set on the phase modulation layer, the distance from the corresponding lattice point to each of the centers of gravity of the modified refractive index elements is greater than 0.30 times and is not greater than 0.50 times of the lattice spacing. In addition, the distance from the corresponding lattice point to the center of gravity of the modified refractive index elements as a whole is greater than 0 and is not greater than 0.30 times of the lattice spacing.

6 Claims, 23 Drawing Sheets

(51) Int. Cl.
  *H01S 5/00* (2006.01)
  *H01S 5/183* (2006.01)
  *H01S 5/343* (2006.01)
(52) U.S. Cl.
  CPC ...... *H01S 5/04254* (2019.08); *H01S 5/18302* (2013.01); *H01S 5/34333* (2013.01); *H01S 5/34326* (2013.01)
(58) Field of Classification Search
  USPC ..................................................... 372/43.01
  See application file for complete search history.

(56) References Cited

FOREIGN PATENT DOCUMENTS

WO   WO-2017/191320 A1   11/2017
WO   WO-2018/030523 A1   2/2018

OTHER PUBLICATIONS

Yoshitaka Kurosaka et al., "Phase-modulating lasers toward on-chip integration", Scientific Reports, 6:30138,2016, p. 1-p. 7.
Y. Kurosaka et al., "Effects of non-lasing band in two-dimensional photonic-crystal lasers clarified using omnidirectional band structure", Opt. Express, 20,2012, p. 21773-p. 21783.
K. Sakai et al., "Coupled-Wave Theory for Square-Lattice Photonic Crystal Lasers With TE Polarization", IEEE J.Q. E., 46,2010, p. 788-p. 795.

\* cited by examiner

| A2 | A1 |
|---|---|
| A3 | A4 |

ORIGINAL IMAGE (b)

| A4<br><br>A2 ROTATION | A3<br><br>A1 ROTATION |
|---|---|
| A1<br><br>A3 ROTATION | A2<br><br>A4 ROTATION |

RESULTING BEAM PATTERN

LIGHT EMISSION DEVICE

TECHNICAL FIELD

The present invention relates to a light emission device.

BACKGROUND ART

A semiconductor light emitting element that forms an arbitrary optical image (output beam pattern) by controlling the phase spectra and intensity spectra of light outputted from a plurality of light emission points arranged two-dimensionally has been studied. One of the structures of such a semiconductor light emitting element is a structure having an active layer and a phase modulation layer optically coupled to the active layer. The phase modulation layer has a base layer and a plurality of modified refractive index regions each having a refractive index different from the refractive index of the base layer. In a case where an imaginary square lattice is set on a plane perpendicular to the thickness direction of the phase modulation layer, the position of the center of gravity of each modified refractive index region is shifted from the position of the lattice point of the imaginary square lattice depending on an optical image to be outputted. Such a semiconductor light emitting element is called an S-iPM (Static-integrable Phase Modulating) laser. An optical image of an arbitrary shape is outputted along the normal direction to a main surface of a substrate provided with a phase modulation layer and an inclined direction intersecting the normal direction. In Non-Patent Document 1, a technique related to an iPM laser is described.

CITATION LIST

Non-Patent Literature

Non-Patent Document 1: Yoshitaka Kurosaka et al., "Phase-modulating lasers toward on-chip integration", Scientific Reports, 6:30138 (2016)

Non-Patent Document 2: Y Kurosaka et al., "Effects of non-lasing band in two-dimensional photonic-crystal lasers clarified using omnidirectional band structure," Opt. Express 20, 21773-21783 (2012).

Non-Patent Document 3: K. Sakai et al., "Coupled-Wave Theory for Square-Lattice Photonic Crystal Lasers With TE Polarization", IEEE J.Q. E. 46, 788-795 (2010).

SUMMARY OF INVENTION

Technical Problem

As a result of examining the conventional techniques, the inventors found the following problem. That is, normally, zero-order light in addition to light (signal light) forming a desired optical image are outputted from the above-described S-iPM laser. This zero-order light is light that is outputted in the normal direction to a main surface of a substrate (that is, the direction perpendicular to a light emitting surface), and is not preferable depending on the design beam pattern in the S-iPM laser. Therefore, zero-order light becomes noise light when a desired optical image is obtained, and it is desirable to remove the zero-order light from the optical image.

The present invention has been made to solve the above-described problem, and an object of the present invention is to provide a light emission device capable of reducing zero-order light included in the output of an S-iPM laser.

Solution to Problem

A light emission device according to the present embodiment emits light that forms an optical image along the normal direction to a main surface of a substrate, an inclined direction intersecting the normal direction, or both the normal direction and the inclined direction. The light emission device includes a light emission unit and a phase modulation layer. The phase modulation layer is a layer provided on the substrate and optically coupled to the light emission unit. In addition, the phase modulation layer has a base layer and a plurality of modified refractive index regions each having a refractive index different from the refractive index of the base layer. Furthermore, the plurality of modified refractive index regions of the phase modulation layer is arranged as follows. That is, in an XYZ orthogonal coordinate system defined by the Z-axis that coincides with the normal direction and an X-Y plane that coincides with one surface of the phase modulation layer including the plurality of modified refractive index regions, the X-Y plane including the X-axis and the Y-axis orthogonal to each other, an imaginary square lattice configured of M1 (integer of 1 or more)×N1 (integer of 1 or more) unit constituent regions R each having a square shape is set on the X-Y plane, and a unit constituent region R (x, y) specified by a coordinate component x (integer of 1 or more and M1 or less) in the X-axis direction and a coordinate component y (integer of 1 or more and N1 or less) in the Y-axis direction is set on the X-Y plane. Under this setting condition, each of centers of gravity G1 of a plurality of modified refractive index elements constituting a modified refractive index region located in the unit constituent region R(x, y) is away from a lattice point O(x, y) which is the center of the unit constituent region R(x, y). Furthermore, when a line segment extending from the lattice point O(x, y) to a center of gravity G2 defined by the plurality of modified refractive index elements located in the unit constituent region R(x, y) as a whole is defined as a first line segment and a line segment passing through the lattice point O(x, y) and parallel to the X-axis direction or the Y-axis direction is defined as a second line segment, the angle formed by these first and second line segments is set so that light that forms an optical image is outputted. Specifically, the distance from the lattice point O(x, y) to each of the centers of gravity G1 of the plurality of modified refractive index elements located in the unit constituent region R(x, y) is greater than 0.30 times and is not greater than 0.50 times of lattice spacing of the imaginary square lattice. In addition, the distance from the lattice point O(x, y) to the center of gravity G2 defined by the plurality of modified refractive index elements located in the unit constituent region R(x, y) as a whole is greater than 0 and is not greater than 0.30 times of the lattice spacing of the imaginary square lattice.

Advantageous Effects of Invention

According to the light emission device of the present embodiment, zero-order light included in output of an S-iPM laser can be reduced.

BRIEF DESCRIPTION OF DRAWINGS

FIGS. 9A and 9B are diagrams for explaining points to be noted when arrangement of the modified refractive index elements is determined by obtaining phase angle distribution from the result of inverse Fourier transform of an optical image.

DESCRIPTION OF EMBODIMENTS

Figure 1:
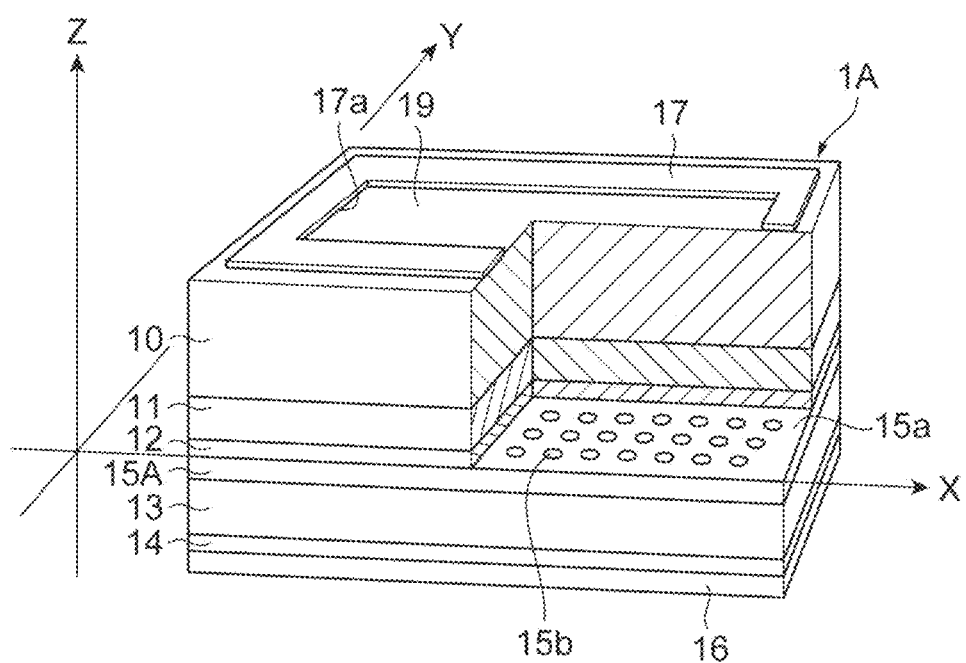
FIG. 1 is a perspective view illustrating a configuration of a semiconductor light emitting element as an example of a light emission device according to the present embodiment.

Description of Embodiment of Invention of Present Application

First, each content of an embodiment of the invention of the present application will be individually pointed out and explained.

(1) A light emission device according to the present embodiment emits light that forms an optical image along the normal direction to a main surface of a substrate, an inclined direction intersecting the normal direction, or both the normal direction and the inclined direction. As an aspect of the present embodiment, the light emission device includes a light emission unit and a phase modulation layer. The phase modulation layer is a layer provided on the substrate and optically coupled to the light emission unit. In addition, the phase modulation layer has a base layer and a plurality of modified refractive index regions each having a refractive index different from the refractive index of the base layer. Furthermore, the plurality of modified refractive index regions of the phase modulation layer is arranged as follows. That is, in an XYZ orthogonal coordinate system defined by the Z-axis that coincides with the normal direction and an X-Y plane that coincides with one surface of the phase modulation layer including the plurality of modified refractive index regions, the X-Y plane including the X-axis and the Y-axis orthogonal to each other, an imaginary square lattice configured of M1 (integer of 1 or more)×N1 (integer of 1 or more) unit constituent regions R each having a square shape is set on the X-Y plane, and a unit constituent region R (x, y) specified by a coordinate component x (integer of 1 or more and M1 or less) in the X-axis direction and a coordinate component y (integer of 1 or more and N1 or less) in the Y-axis direction is set on the X-Y plane. Under this setting condition, each of centers of gravity G1 of a plurality of modified refractive index elements constituting a modified refractive index region located in the unit constituent region R(x, y) is away from a lattice point O(x, y) which is the center of the unit constituent region R(x, y). Furthermore, when a line segment extending from the lattice point O(x, y) to a center of gravity G2 defined by the plurality of modified refractive index elements located in the unit constituent region R(x, y) as a whole is defined as a first line segment and a line segment passing through the lattice point O(x, y) and parallel to the X-axis direction or the Y-axis direction is defined as a second line segment, the angle formed by these first and second line segments is set so that light that forms an optical image is outputted. Specifically, the distance from the lattice point O(x, y) to each of the centers of gravity G1 of the plurality of modified refractive index elements located in the unit constituent region R(x, y) is greater than 0.30 times and is not greater than 0.50 times of lattice spacing of the imaginary square lattice. In addition, the distance from the lattice point O(x, y) to the center of gravity G2 defined by the plurality of modified refractive index elements located in the unit constituent region R(x, y) as a whole is greater than 0 and is not greater than 0.30 times of the lattice spacing of the imaginary square lattice. Note that the center of gravity G2 is the center of gravity (combined center of gravity) obtained by combining the centers of gravity of the plurality of modified refractive index elements, and means the center of gravity of the one modified refractive index region substantially constituted by the plurality of modified refractive index elements.

According to the light emission device having the above-described structure, it is possible to output light for forming an optical image of an arbitrary shape along the inclined direction that intersects the normal direction to the main surface of the substrate. In addition, in the light emission device, the distance from the lattice point $O(x, y)$ to each of the centers of gravity G1 of the plurality of modified refractive index elements located in the unit constituent region $R(x, y)$ is greater than 0.30 times and is not greater than 0.50 times of the lattice spacing of the imaginary square lattice. According to the knowledge of the present inventors to be described later, since the distance from the lattice point $O(x, y)$ to each center of gravity G1 is within the above range in each unit constituent region $R(x, y)$, zero-order light included in the output of the S-iPM laser can be reduced. Furthermore, in the light emission device, the distance from the lattice point $O(x, y)$ to the center of gravity G2 defined by the plurality of modified refractive index elements located in the unit constituent region $R(x, y)$ as a whole is greater than 0 and is not greater than 0.30 times of the lattice spacing of the imaginary square lattice. In each unit constituent region $R(x, y)$, since the distance from the lattice point $O(x, y)$ to the center of gravity G2 obtained by combining the respective centers of gravity G1 falls within the above range, a practical S-iPM laser with a reduced S/N ratio of the output beam pattern can be obtained.

(2) As one aspect of the present embodiment, the modified refractive index region located in the unit constituent region $R(x, y)$ may include as the above-described plurality of modified refractive index elements, at least two modified refractive index elements having areas different from each other. As one aspect of the present embodiment, the respective distances from the lattice point $O(x, y)$ to the centers of gravity G1 of the above-described plurality of modified refractive index elements located in the unit constituent region $R(x, y)$ may be different from each other. As one aspect of the present embodiment, the modified refractive index region located in the unit constituent region $R(x, y)$ may include as the above-described plurality of modified refractive index elements, two modified refractive index elements arranged without satisfying the relationship of point symmetry with respect to the lattice point $O(x, y)$. For example, in a case where the light emission device has at least one of these aspects, in one unit constituent region, it is possible to separate the position of the center of gravity G2 from the corresponding lattice point, the position of the center of gravity G2 being defined by the plurality of modified refractive index elements as a whole constituting the modified refractive index region associated with the unit constituent region.

(3) As one aspect of the present embodiment, the modified refractive index region located in the unit constituent region $R(x, y)$ may include as the above-described plurality of modified refractive index elements, three or more modified refractive index elements. According to this aspect, the area per one modified refractive index element can be made small. As a result, it is possible to suppress optical coupling between modified refractive index regions in adjacent unit constituent regions due to spread of the modified refractive index region caused by a manufacturing error or the like.

(4) As one aspect of the present embodiment, the distance from the lattice point $O(x, y)$ to each of the centers of gravity G1 of the modified refractive index elements located in the unit constituent region $R(x, y)$ is preferably 0.38 times of the lattice spacing of the imaginary square lattice. According to the knowledge of the present inventors to be described later, in a case where the distance from the lattice point $O(x, y)$ to each of the centers of gravity G1 of the modified refractive index elements is 0.38 times of the lattice spacing in one unit constituent region $R(x, y)$, zero-order light included in output of the S-iPM laser can be brought close to zero.

As described above, each aspect pointed out in the [Description of Embodiment of Present Application] can be applied to all of the remaining aspects or to all combinations of the remaining aspects.

DETAILS OF EMBODIMENT OF INVENTION
OF PRESENT APPLICATION

Hereinafter, a specific structure of a light emission device according to the present embodiment will be described in detail with reference to the accompanying drawings. Note that the present invention is not limited to these examples but is intended to be indicated by the claims and to include all modifications within the meaning and the scope of the claims and the equivalents thereof. Note that in the description of the drawings, identical elements are denoted by identical reference signs, and overlapping descriptions are omitted.

Figure 2:
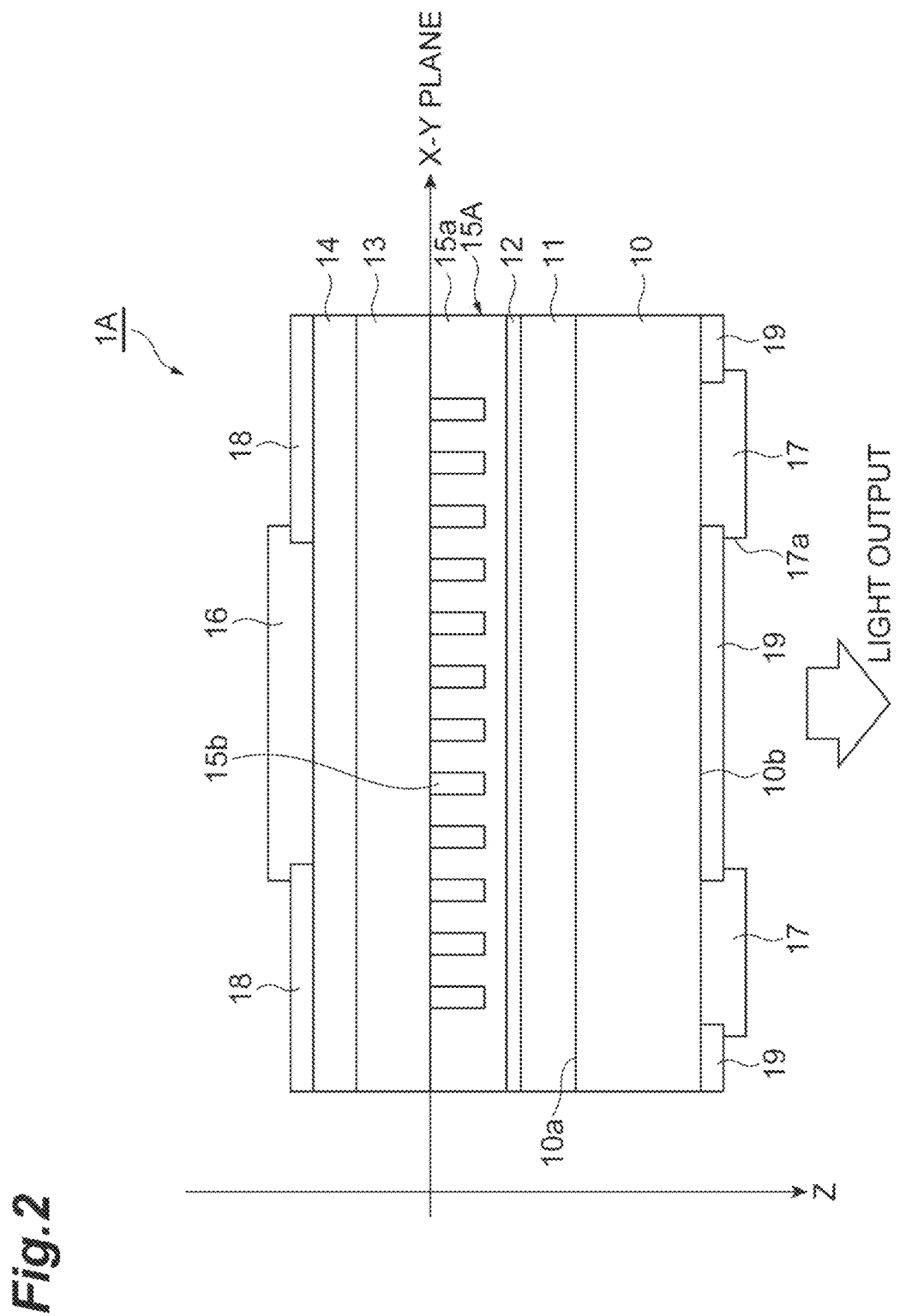
FIG. 2 is a cross-sectional view illustrating a laminated structure of the semiconductor light emitting element.

FIG. 1 is a perspective view illustrating a configuration of a semiconductor light emitting element 1A as an example of a light emission device according to the present embodiment. FIG. 2 is a cross-sectional view illustrating a laminated structure of the semiconductor light emitting element 1A. Note that an XYZ orthogonal coordinate system is defined in which an axis extending along the thickness direction of the semiconductor light emitting element 1A is the Z-axis. The semiconductor light emitting element 1A is an S-iPM laser that forms a standing wave in the X-Y in-plane direction and outputs a phase-controlled plane wave in the Z-axis direction. As will be described later, the semiconductor light emitting element 1A outputs light that forms an optical image (beam pattern) of an arbitrary shape along the normal direction to a main surface 10a of a semiconductor substrate 10 (that is, the Z-axis direction) or an inclined direction that intersects the normal direction, or both the normal direction and the inclined direction.

As illustrated in FIGS. 1 and 2, the semiconductor light emitting element 1A includes an active layer 12 serving as a light emission unit provided on the semiconductor substrate 10, a pair of cladding layers 11 and 13 sandwiching the active layer 12, and a contact layer 14 provided on the cladding layer 13. Each of the semiconductor substrate 10 and the respective layers 11 to 14 is comprised of a compound semiconductor such as a GaAs semiconductor, an InP semiconductor, or a nitride semiconductor. Each of the energy band gap of the cladding layer 11 and the energy band gap of the cladding layer 13 is greater than the energy band gap of the active layer 12. The thickness directions of the semiconductor substrate 10 and the respective layers 11 to 14 coincide with the Z-axis direction.

The semiconductor light emitting element 1A further includes a phase modulation layer 15A optically coupled to the active layer 12. In the present embodiment, the phase modulation layer 15A is provided between the active layer 12 and the cladding layer 13. A light guide layer may be provided between the active layer 12 and the cladding layer 13 and/or between the active layer 12 and the cladding layer 11 as necessary. In a case where the light guide layer is provided between the active layer 12 and the cladding layer 13, the light guide layer is provided between the cladding layer 13 and the phase modulation layer 15A and/or between the active layer 12 and the phase modulation layer 15A. The thickness direction of the phase modulation layer 15A coincides with the Z-axis direction. Note that the light guide layer may include a carrier barrier layer for efficiently confining carriers in the active layer 12.

Figure 3:
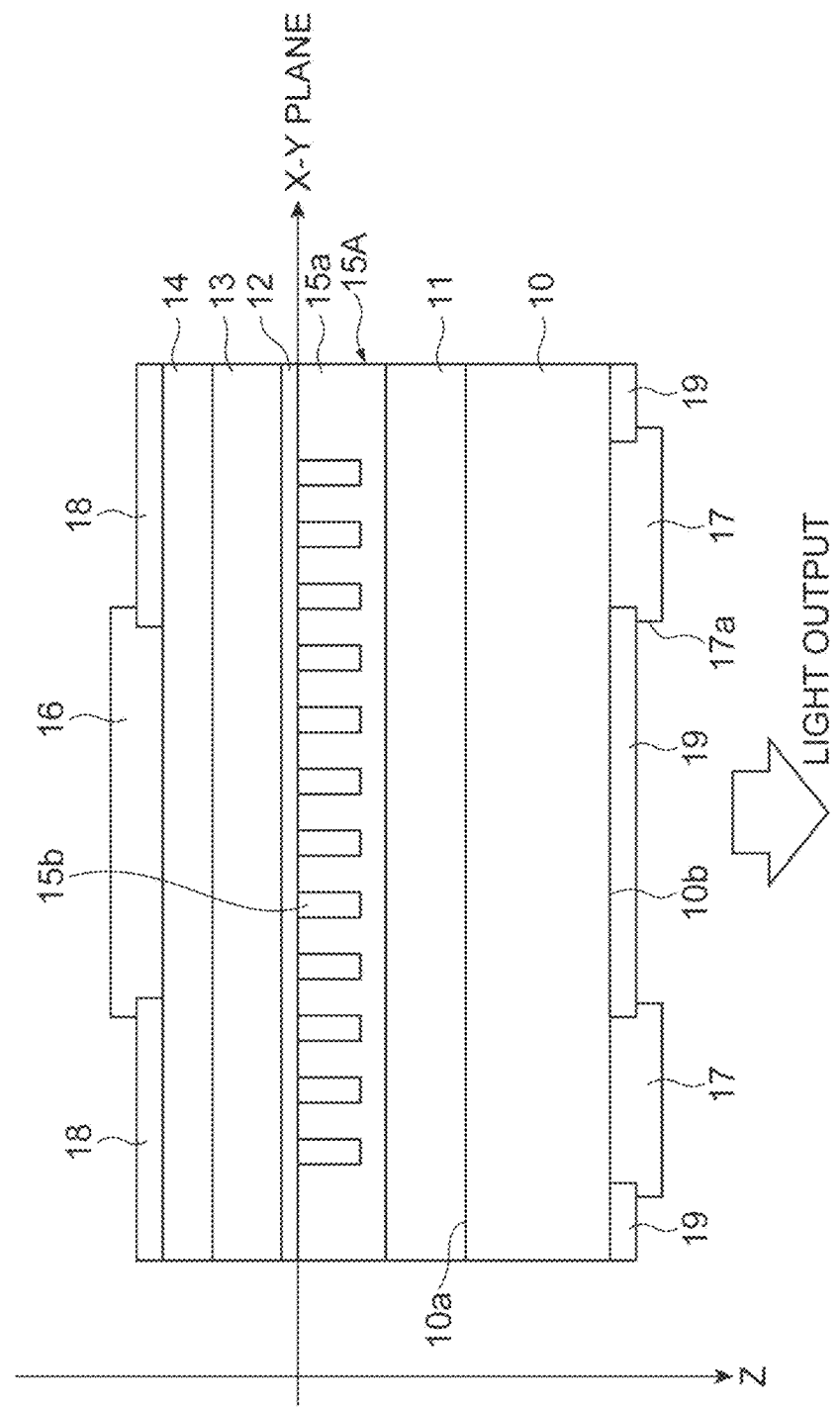
FIG. 3 is a view illustrating a laminated structure of a semiconductor light emitting element in a case where a phase modulation layer is provided between a lower cladding layer and an active layer.

As illustrated in FIG. 3, the phase modulation layer 15A may be provided between the cladding layer 11 and the active layer 12. Further, in a case where the light guide layer is provided between the active layer 12 and the cladding layer 11, the light guide layer is provided between the cladding layer 11 and the phase modulation layer 15A and/or between the active layer 12 and the phase modulation layer 15A.

As illustrated in FIGS. 2 and 3, the phase modulation layer 15A is constituted by a base layer 15a comprised of a first refractive index medium and a plurality of modified refractive index regions existing in the base layer 15a. Note that each of the plurality of modified refractive index regions is comprised of a second refractive index medium having a refractive index different from the refractive index of the first refractive index medium. The plurality of modified refractive index regions is arranged in the plurality of unit constituent regions, respectively. Each of the plurality of unit constituent regions is centered on a lattice point of the imaginary square lattice. The modified refractive index region arranged in each unit constituent region is constituted by a plurality of modified refractive index elements 15b. In the imaginary square lattice (lattice spacing a), a center of gravity position is arranged so as to be rotated on a circumference apart from the lattice point position by a method to be described later. In the phase modulation layer 15A, in a case where the equivalent refractive index of the mode is $n_0$, the wavelength $\lambda_0$ (=a×$n_0$, a is the lattice spacing) selected by the phase modulation layer 15A is included in the light emission wavelength range of the active layer 12. The phase modulation layer 15A can select the wavelength $\lambda_0$ in the light emission wavelengths of the active layer 12 and output the wavelength $\lambda_0$ to the outside. The laser light that has entered the phase modulation layer 15A forms a predetermined mode according to arrangement of the modified refractive index elements 15b in the phase modulation layer 15A, and is outputted to the outside from a surface of the semiconductor light emitting element 1A as a laser beam having a desired pattern.

The semiconductor light emitting element 1A further includes an electrode 16 provided on the contact layer 14 and an electrode 17 provided on a back surface 10b of the semiconductor substrate 10. The electrode 16 is in ohmic contact with the contact layer 14, and the electrode 17 is in ohmic contact with the semiconductor substrate 10. Furthermore, the electrode 17 has an opening 17a. The electrode 16 is provided in a central region of the contact layer 14. The portion of the contact layer 14 other than the electrode 16 is covered with a protective film 18 (see FIG. 2). Note that the contact layer 14 that is not in contact with the electrode 16 may be removed. The portion of the back surface 10b of the semiconductor substrate 10 other than the electrode 17 (including the inside of the opening 17a) is covered with an antireflection film 19. The antireflection film 19 in the region other than the opening 17a may be removed.

When a driving current is supplied between the electrode 16 and the electrode 17, light is generated in the active layer 12 due to recombination of electrons and electron holes. The electrons and electron holes that contribute to the light emission and the generated light are efficiently confined between the cladding layer 11 and the cladding layer 13.

Light emitted from the active layer 12 is also distributed inside the phase modulation layer 15A and forms a predetermined layer thickness direction mode according to the laminated structure and a predetermined in-plane mode according to the lattice structure inside the phase modulation layer 15A. Laser light outputted from the phase modulation layer 15A is directly outputted from the back surface 10b to the outside of the semiconductor light emitting element 1A through the opening 17a. Alternatively, the laser light from the phase modulation layer 15A is reflected by the electrode 16 and then outputted from the back surface 10b to the outside of the semiconductor light emitting element 1A through the opening 17a. At this time, zero-order light included in the laser light is outputted in the normal direction to the main surface 10a. In contrast, signal light included in the laser light is outputted along both the normal direction to the main surface 10a and an inclined direction intersecting the normal direction. The signal light forms a desired optical image. The signal light is mainly +1 order light and −1 order light.

In one example, the semiconductor substrate 10 is a GaAs substrate, and each of the cladding layer 11, the active layer 12, the cladding layer 13, the contact layer 14, and the phase modulation layer 15A is a compound semiconductor layer comprised of a group III element and a group V element. As a specific example, the cladding layer 11 is an AlGaAs layer. The active layer 12 has a multiple quantum well structure (barrier layer: AlGaAs/well layer: InGaAs). In the phase modulation layer 15A, the base layer 15a is a GaAs layer and the modified refractive index element 15b is a hole. The cladding layer 13 is an AlGaAs layer. The contact layer 14 is a GaAs layer.

In AlGaAs, the energy band gap and the refractive index of the AlGaAs can be easily changed by changing the Al composition ratio. In $Al_xGa_{1-x}As$, if the composition ratio x of Al having a relatively small atomic radius is decreased (increased), the energy band gap having a positive correlation with the composition ratio becomes smaller (greater). In addition, the energy band gap of InGaAs obtained by mixing In with a large atomic radius into GaAs becomes small That is, the Al composition ratio of each of the cladding layers 11 and 13 is higher than the Al composition ratio of the barrier layer (AlGaAs) of the active layer 12. The Al composition ratio of each of the cladding layers 11 and 13 is set to, for example, 0.2 to 1.0, and is preferably 0.4. The Al composition ratio of the barrier layer of the active layer 12 is set to, for example, 0 to 0.3, and is preferably 0.15.

In another example, the semiconductor substrate 10 is an InP substrate, and each of the cladding layer 11, the active layer 12, the phase modulation layer 15A, the cladding layer 13, and the contact layer 14 is comprised of, for example, an InP compound semiconductor. As a specific example, the cladding layer 11 is an InP layer. The active layer 12 has a multiple quantum well structure (barrier layer: GaInAsP/well layer: GaInAsP). In the phase modulation layer 15A, the base layer 15a is GaInAsP and the modified refractive index element 15b is a hole. The cladding layer 13 is an InP layer. The contact layer 14 is a GaInAsP layer.

In yet another example, the semiconductor substrate 10 is a GaN substrate, and each of the cladding layer 11, the active layer 12, the phase modulation layer 15A, the cladding layer 13, and the contact layer 14 is comprised of, for example, a nitride compound semiconductor. As a specific example, the cladding layer 11 is an AlGaN layer. The active layer 12 has a multiple quantum well structure (barrier layer: InGaN/well layer: InGaN). In the phase modulation layer 15A, the base layer 15a is a GaN layer and the modified refractive index element 15b is a hole. The cladding layer 13 is an AlGaN layer. The contact layer 14 is a GaN layer.

The cladding layer 11 has a conductivity type identical to the conductivity type of the semiconductor substrate 10. Each of the cladding layer 13 and the contact layer 14 has a conductivity type opposite to the conductive type of the semiconductor substrate 10. In one example, each of the semiconductor substrate 10 and the cladding layer 11 is an n-type, and each of the cladding layer 13 and the contact layer 14 is a p-type. In a case where the phase modulation layer 15A is provided between the active layer 12 and the cladding layer 11, the phase modulation layer 15A has a conductivity type identical to the conductive type of the semiconductor substrate 10. In contrast, in a case where the phase modulation layer 15A is provided between the active layer 12 and the cladding layer 13, the phase modulation layer 15A has a conductivity type opposite to the conductivity type of the semiconductor substrate 10. Note that impurity concentration is, for example, $1 \times 10^{16}$ to $1 \times 10^{21}/cm^3$. The active layer 12 is intrinsic (i-type) in which no impurities are intentionally doped, and the impurity concentration is $1 \times 10^{16}/cm^3$ or less. However, in a case where loss caused by light absorption due to the impurity level is small, impurity doping may be performed. Note that regarding the impurity concentration of the phase modulation layer 15A, the phase modulation layer 15A may be intrinsic (i-type), for example, in a case where it is necessary to suppress the effect of loss caused by light absorption due to the impurity level.

The thickness of the cladding layer 11 is $1 \times 10^3$ to $3 \times 10^3$ (nm), and is preferably $2 \times 10^3$ (nm). The thickness of the active layer 12 is 10 to 100 (nm), and is preferably 30 (nm). The thickness of the phase modulation layer 15A is 50 to 200 (nm), and is preferably 100 (nm). The thickness of the cladding layer 13 is $1 \times 10^3$ to $3 \times 10^3$ (nm), and is preferably $2 \times 10^3$ (nm). The thickness of the contact layer 14 is 50 to 500 (nm), and is preferably 200 (nm).

In the above structure, the modified refractive index element 15b is a hole. However, the modified refractive index element 15b may be formed by embedding a semiconductor having a refractive index different from the refractive index of the base layer 15a in a hole. In that case, for example, after a hole in the base layer 15a is formed by etching, the semiconductor is embedded in the hole by using a metal organic chemical vapor deposition method, a sputtering method, or an epitaxial method. For example, in a case where the base layer 15a is comprised of GaAs, the modified refractive index element 15b may be comprised of AlGaAs. In addition, after the modified refractive index element 15b is formed by embedding a semiconductor in the hole of the base layer 15a, the semiconductor identical to the modified refractive index element 15b may be further deposited thereon. Note that in a case where the modified refractive index element 15b is a hole, an inert gas such as argon or nitrogen, or a gas such as hydrogen or air may be enclosed in the hole.

The antireflection film 19 is comprised of, for example, a dielectric single layer film such as a silicon nitride (for example, SiN) or a silicon oxide (for example, $SiO_2$) or a dielectric multilayer film. As the dielectric multilayer film, a film in which two or more types of dielectric layers selected from a dielectric layer group such as titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), zirconium oxide ($ZrO_2$), and the like can be used. For example, in the case of a dielectric single layer film, a film having an optical thickness of $\lambda/4$ for light having a wavelength) is laminated. In addition, the protective film 18 is an insulating film such as a silicon nitride (for example, SiN) or a silicon oxide (for example, $SiO_2$). In a case where each of the semiconductor substrate 10 and the contact layer 14 is comprised of a GaAs semiconductor, the electrode 16 can be comprised of material containing Au and at least one of Cr, Ti, and Pt. For example, the electrode 16 has a laminated structure of a Cr layer and a Au layer. The electrode 17 can be comprised of material containing Au and at least one of AuGe and Ni. For example, the electrode 17 has a laminated structure of a AuGe layer and a Au layer. Note that materials of the electrodes 16 and 17 are not limited to the above-described elements as long as ohmic contact can be realized.

Note that laser light can be outputted from a surface of the contact layer 14 by changing the shapes of the electrodes. That is, in a case where the opening 17a of the electrode 17 is not provided and the electrode 16 is opened on the surface of the contact layer 14, a laser beam is outputted from the surface of the contact layer 14 to the outside. In this case, the antireflection film is provided inside and around the opening of the electrode 16.

Figure 4:
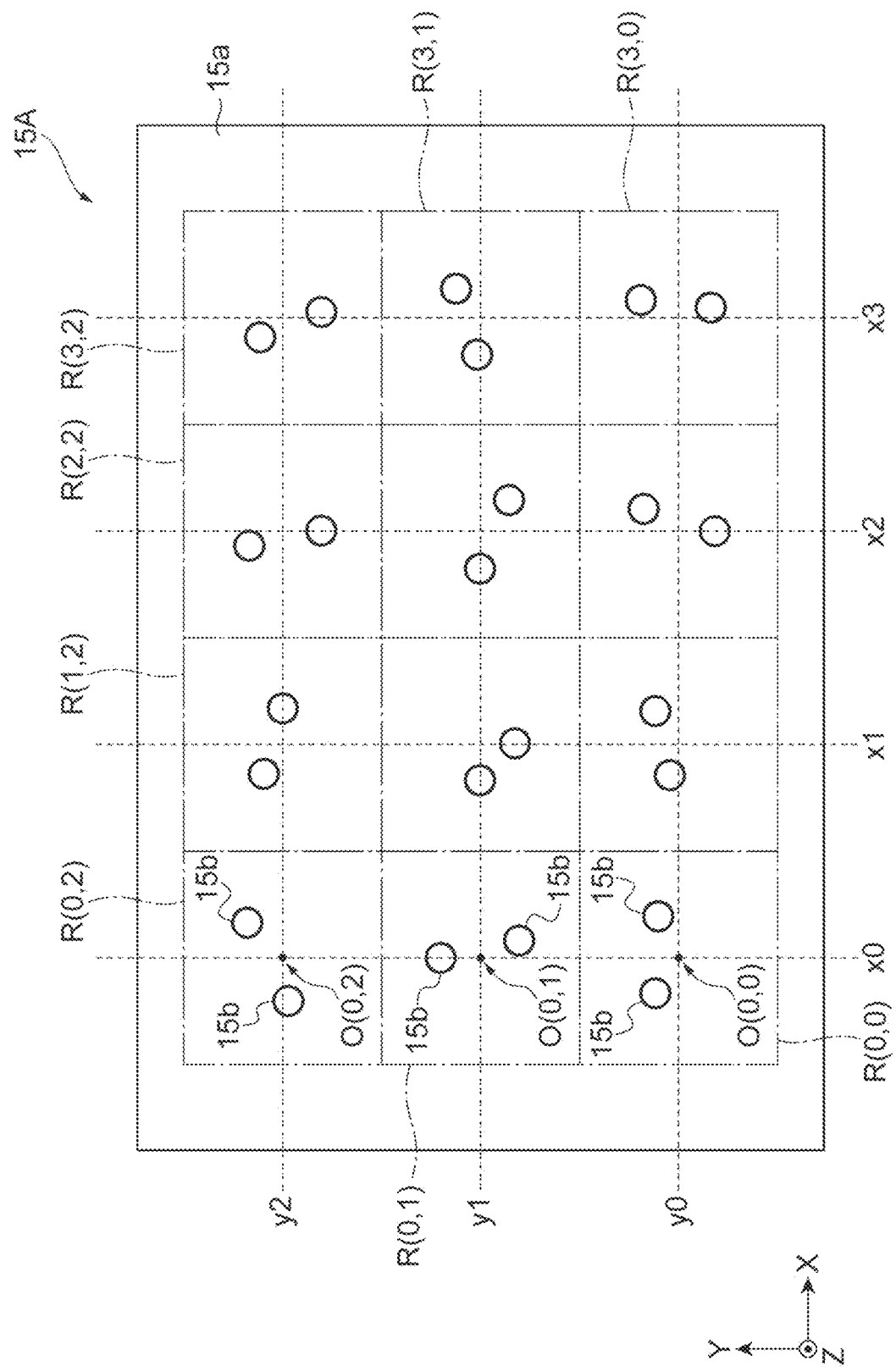
FIG. 4 is a plan view of the phase modulation layer.

FIG. 4 is a plan view of the phase modulation layer 15A. As illustrated in FIG. 4, an imaginary square lattice is set on a design surface (reference surface) of the phase modulation layer 15A that coincides with the X-Y plane. It is assumed that one side of the square lattice is parallel to the X-axis and the other side is parallel to the Y-axis. At this time, unit constituent regions R each having a square shape and centered on a lattice point O of the square lattice can be set in a two-dimensional manner over a plurality of columns along the X-axis and a plurality of rows along the Y-axis. The plurality N (N is an integer of 2 or more, and the case of N=2 is illustrated in the figure) of modified refractive index elements 15b is provided in each of the unit constituent regions R. That is, the two or more modified refractive index elements 15b provided in one unit constituent region R constitute a modified refractive index region corresponding to the one unit constituent region R. The planar shape of each of the modified refractive index elements 15b is, for example, a circular shape. In each unit constituent region R, the lattice point O may be located outside the modified refractive index element 15b or may be included inside the modified refractive index element 15b.

Specifically, in FIG. 4, broken lines denoted by x0 to x3 indicate center positions in the X-axis direction in the unit constituent regions R, and broken lines denoted by y0 to y2 indicate center positions in the Y-axis direction in the unit constituent regions R. Therefore, the respective intersections of the broken lines x0 to x3 and the broken lines y0 to y2 are centers O(0,0) to O(3,2), that is, lattice points, of the unit constituent regions R(0,0) to R(3,2) respectively. The lattice constant of this imaginary square lattice is a. Note that the lattice constant a is adjusted according to the light emission wavelength.

The ratio of the area S of the modified refractive index elements 15b in one unit constituent region R is called a filling factor (FF). If the lattice spacing of the square lattices is a, the filling factor FF of the modified refractive index elements 15b is given as $S/a^2$. S is the sum of the areas of the N modified refractive index elements 15b in one unit constituent region R. For example, in a case where the shapes of the N modified refractive index elements 15b are perfect circular shapes having an identical diameter, $S=N \times \pi(d/2)^2$ is given by using the diameter d of the perfect circle. In addition, in a case where the shapes of the N modified refractive index elements 15b are squares having an identical size, S=N×LA² is given by using the length LA of one side of the square.

Figure 5:
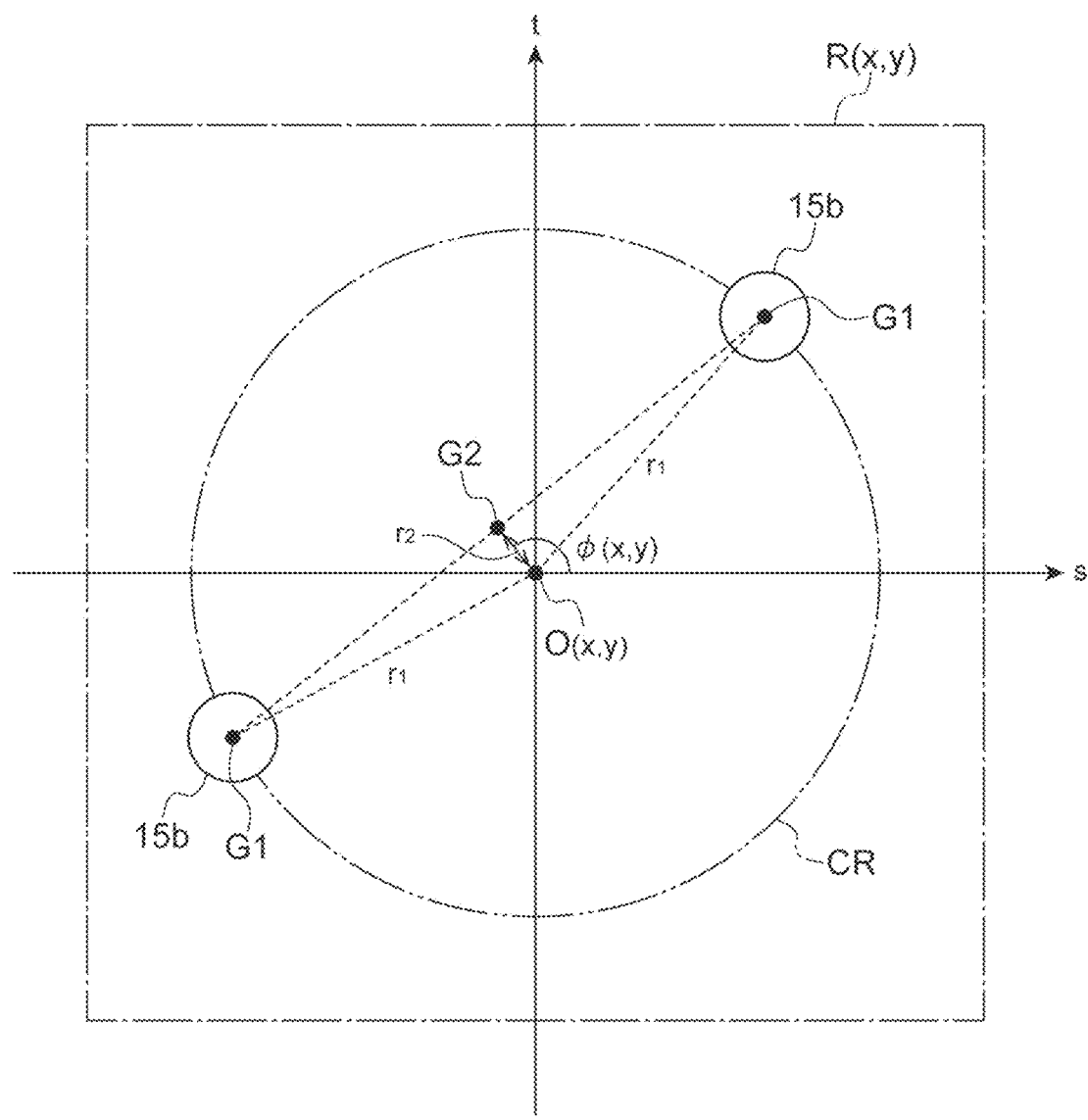
FIG. 5 is a diagram illustrating a positional relationship of modified refractive index elements in the phase modulation layer.

FIG. 5 is a diagram illustrating part (unit constituent region R) of the phase modulation layer 15A in an enlarged manner. Specifically, position information in the unit constituent region (x, y) illustrated in FIG. 5 is specified by an s-axis passing through the lattice point (x, y) and parallel to the X-axis and a t-axis passing through the lattice point (x, y) and parallel to the Y-axis. As illustrated in FIG. 5, each of the N modified refractive index elements 15b has a center of gravity G1, and the N modified refractive index elements 15b as a whole have a center of gravity G2 (center of gravity of the modified refractive index region constituted by the N modified refractive index elements 15b in one unit constituent region R). Here, the angle formed by the vector from the lattice point O(x, y) toward the center of gravity G2 and the s-axis is φ(x, y). In a case where the rotation angle φ is 0°, the direction of the vector connecting the lattice point O(x, y) and the center of gravity G2 coincides with the positive direction of the s-axis. In addition, the length of the vector connecting the lattice point O(x, y) and the center of gravity G2 is $r_2(x, y)$. In one example, $r_2(x, y)$ is constant regardless of the x component and the y component (over the phase modulation layer 15A as a whole).

As illustrated in FIG. 4, the direction of the vector connecting the lattice point O(x, y) and the center of gravity G2, that is, the rotation angle φ of the center of gravity G2 of the modified refractive index region constituted by the N modified refractive index elements 15b with the lattice point O(x, y) as the center, is individually set for each lattice point O(x, y) according to the desired optical image. The rotation angle distribution φ(x, y) has a specific value for each position determined by the values of the x component and the y component; however, is not always represented by a specific function. That is, the rotation angle distribution φ(x, y) is determined on the basis of the phase distribution extracted from the complex amplitude distribution obtained by performing inverse Fourier transform on a desired optical image. Note that when the complex amplitude distribution is determined from a desired optical image, reproducibility of a beam pattern can be improved by applying an iterative algorithm such as a Gerchberg-Saxton (GS) method that is commonly used in calculation of hologram generation.

In the present embodiment, a desired optical image can be obtained by determining the rotation angle distribution φ(x, y) according to the following procedure. First, as a first precondition, in the XYZ orthogonal coordinate system defined by the Z-axis that coincides with the normal direction and the X-Y plane that coincides with one surface of the phase modulation layer 15A including the plurality of modified refractive index elements 15b, the X-Y plane including the X-axis and the Y-axis orthogonal to each other, an imaginary square lattice configured of M1 (integer of 1 or more)×N1 (integer of 1 or more) unit constituent regions R each having a square shape is set on the X-Y plane.

Figure 6:
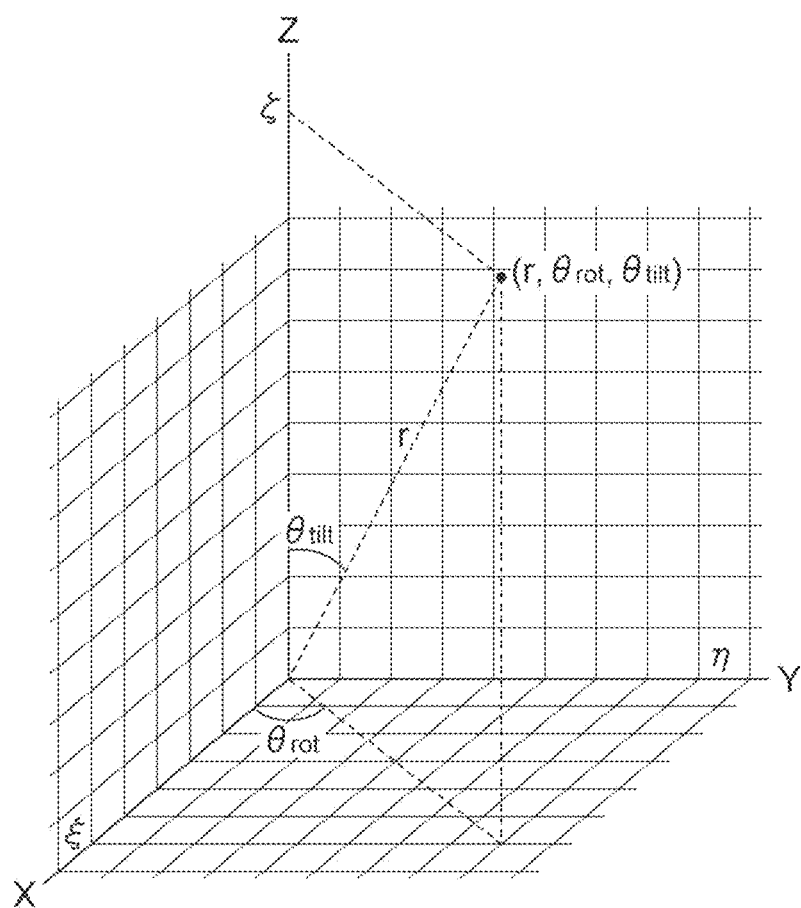
FIG. 6 is a diagram for explaining coordinate conversion from spherical coordinates to coordinates in an XYZ orthogonal coordinate system.

As a second precondition, the coordinates (ξ, η, ζ) in the XYZ orthogonal coordinate system satisfy the relationships expressed by the following Formulae (1) to (3) with respect to the spherical coordinates (r, $\theta_{rot}$, $\theta_{tilt}$) defined by the length r of a radius vector, the tilt angle $\theta_{tilt}$ from the Z-axis, and the rotation angle $\theta_{rot}$ from the X-axis specified on the X-Y plane, as in FIG. 6. Note that FIG. 6 is a diagram for explaining coordinate conversion from the spherical coordinates (r, $\theta_{rot}$, $\theta_{tilt}$) to the coordinates (ξ, η, ζ) in the XYZ orthogonal coordinate system, and the coordinates (ξ, η, ζ) express a design optical image on a predetermined plane set in the XYZ orthogonal coordinate system which is the real space. When a beam pattern corresponding to an optical image outputted from the semiconductor light emitting element is a set of bright spots directed in the direction defined by the angles $\theta_{tilt}$ and $\theta_{rot}$, the angles $\theta_{tilt}$ and $\theta_{rot}$ are converted into a coordinate value $k_x$ on the Kx-axis corresponding to the X-axis, the coordinate value $k_x$ being a normalized wavenumber defined by the following Formula (4), and a coordinate value $k_y$ on the Ky-axis corresponding to the Y-axis and orthogonal to the Kx-axis, the coordinate value $k_y$ being a normalized wavenumber defined by the following Formula (5). The normalized wavenumber means a wavenumber that is normalized with the wavenumber corresponding to the lattice spacing of an imaginary square lattice being 1.0. At this time, in the wavenumber space defined by the Kx-axis and Ky-axis, a specific wavenumber range including a beam pattern corresponding to an optical image is configured of M2 (integer of 1 or more)×N2 (integer of 1 or more) image regions FR each having a square shape. Note that the integer M2 does not have to coincide with the integer M1. Similarly, the integer N2 need not coincide with the integer N1. In addition, Formulae (4) and (5) are disclosed in, for example, the above Non-Patent Document 2.

$$\xi = r \sin \theta_{tilt} \cos \theta_{rot} \tag{1}$$

$$\eta = r \sin \theta_{tilt} \sin \theta_{rot} \tag{2}$$

$$\zeta = r \cos \theta_{tilt} \tag{3}$$

$$k_x = a/\lambda \sin \theta_{tilt} \cos \theta_{rot} \tag{4}$$

$$k_y = a/\lambda \sin \theta_{tilt} \sin \theta_{rot} \tag{5}$$

Lattice Constant of Imaginary Square Lattice
Oscillation Wavelength

As a third precondition, in the wavenumber space, the complex amplitude F(x, y) obtained by subjecting each image area FR($k_x$, $k_y$) specified by the coordinate component $k_x$ (integer of 0 or more and M2−1 or less) in the Kx-axis direction and the coordinate component $k_y$ (integer of 0 or more and N2−1 or less) in the Ky-axis direction to two-dimensional inverse Fourier transform into the unit constituent region R(x, y) on the X-Y plane specified by the coordinate component x in the X-axis direction and the coordinate component y in the Y-axis direction is expressed as the following Formula (6) with j as an imaginary unit. In addition, if the amplitude term is A(x, y) and the phase term is P(x, y), the complex amplitude F(x, y) is defined by the following Formula (7). Furthermore, as a fourth precondition, the unit constituent region R(x, y) is defined by the s-axis and t-axis which are parallel to the X-axis and the Y-axis, respectively, and are orthogonal to each other at the lattice point O(x, y), which is the center of the unit constituent region R(x, y).

$$F(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \tag{6}$$

$$F(x, y) = A(x, y) \times \exp[jP(x, y)] \tag{7}$$

$$F(x,y)=A(x,y)=\exp[jP(x,y)] \tag{7}$$

Under the above first to fourth preconditions, the phase modulation layer 15A is configured to satisfy the following first and second conditions. That is, the first condition is that the center of gravity G2 is arranged in the unit constituent region R(x, y) in a state of being separated from the lattice point O(x, y). In addition, the second condition is that the corresponding modified refractive index element 15b is arranged in the unit constituent region R(x, y) so that in a state where the line segment length $r_2$(x, y) from the lattice point O(x, y) to the corresponding center of gravity G2 is set to a common value in each of the M1×N1 unit constituent regions R, the angle φ(x, y) formed by the line segment connecting the lattice point O(x, y) and the corresponding center of gravity G2 and the s-axis satisfies the relationship φ(x,y)=C×P(x,y)+B, where C: proportional constant, for example 180°/π, and B: an arbitrary constant, for example, 0.

Figure 7:
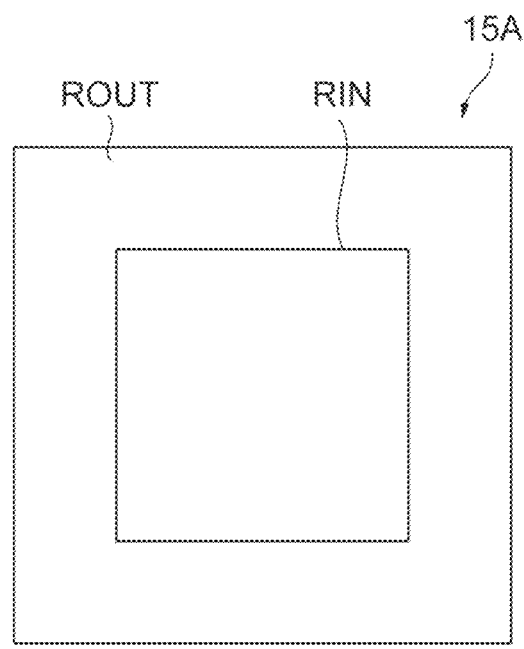
FIG. 7 is a plan view illustrating an example in which a refractive index substantially periodic structure is applied only in a specific region of the phase modulation layer.

FIG. 7 is a plan view illustrating an example in which a refractive index structure in FIG. 4 is applied only in a specific region of the phase modulation layer. In the example illustrated in FIG. 7, a refractive index structure (example: the structure in FIG. 4) for outputting a target beam pattern is formed inside an inner region RIN having a square shape. In contrast, in an outer region ROUT that surrounds the inner region RIN, a modified refractive index region which has a true circular shape and whose center of gravity coincides with the lattice point position of the square lattice is arranged. For example, the filling factor FF in the outer region ROUT is set to 12%. In addition, the lattice spacing of the square lattice imaginarily set is identical (=a) both inside the inner region RIN and inside the outer region ROUT. In the case of this structure, there is an advantage in that it is possible to suppress generation of high-frequency noise (so-called window function noise) that is caused by an abrupt change of light intensity in the peripheral portion of the inner region RIN due to light being distributed in the outer region ROUT. In addition, light leakage in the in-plane direction can be suppressed, and reduction in threshold current can be expected.

Figure 8:
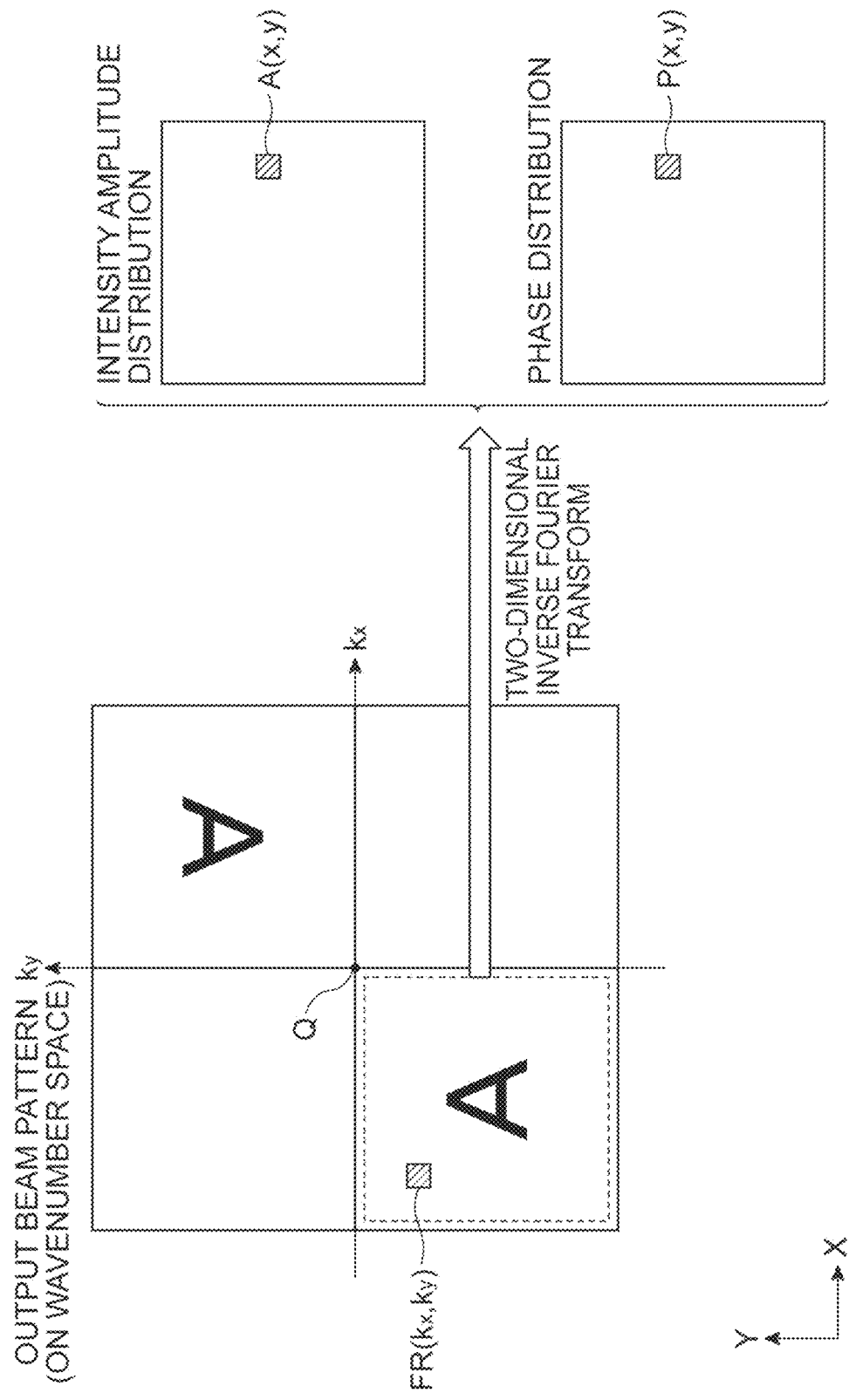
FIG. 8 is a diagram for explaining the relationship between an optical image obtained by forming an image of an output beam pattern of the semiconductor light emitting element and rotation angle distribution in the phase modulation layer.

FIG. 8 is a diagram for explaining the relationship between the output beam pattern (optical image) of the semiconductor light emitting element 1A and distribution of the rotation angle φ(x, y) in the phase modulation layer 15A in the present embodiment. Specifically, a Kx-Ky plane obtained by converting a beam projection region that is the projection range of the output beam pattern (installation surface of the designed optical image represented by the coordinates (x, y, z) in the XYZ orthogonal coordinate system) on the wavenumber space is considered. The Kx-axis and the Ky-axis that define the Kx-Ky plane are orthogonal to each other, and are associated with the angle with respect to the normal direction obtained when the output direction of the target output beam pattern is swung from the normal direction (Z-axis direction) of the light output surface to the light output surface by using the above Formulae (1) to (5). Note that the center Q of the output beam pattern is located on the axis extending along the normal direction of the main surface 10a of the semiconductor substrate 10, and FIG. 8 illustrates four quadrants with the center Q as the origin. The example of FIG. 8 illustrates a case where an optical image is obtained in each of the first quadrant and the third quadrant; however, it is also possible to obtain an image in each of the second quadrant and the fourth quadrant or all the quadrants. In the present embodiment, as illustrated in FIG. 8, an optical image point-symmetric with respect to the origin is obtained. FIG. 8 illustrates, as an example, a case where the letter "A" is obtained as +1 order light in the third quadrant and the pattern obtained by rotating the letter "A" by 180 degrees is obtained as −1 order light in the first quadrant. Note that in the case of rotationally symmetric optical images (for example, a cross, a circle, a double circle, or the like), the optical images are overlapped and observed as one optical image.

The output beam pattern (optical image) of the semiconductor light emitting element 1A includes at least one of a spot, a straight line, a cross, a line drawing, a lattice pattern, a photograph, a striped pattern, CG (computer graphics), and a letter.

As described above, in a case where a desired optical image is to be obtained, it is preferable that the desired optical image is converted into an image on the wavenumber space, the obtained optical image is subjected to inverse Fourier transform, and the rotation angle distribution φ(x, y) corresponding to the phase of the complex amplitude is given to the center of gravity G2 defined by the plurality of modified refractive index elements 15b. Note that as the desired optical image, the far-field image subjected Fourier transform of the laser beam can have various shapes such as a single or multiple spot shapes, an annular shape, a linear shape, a letter shape, a double annular shape, or a Laguerre-Gaussian beam shape. Since the beam direction can also be controlled, a one-dimensional or two-dimensional arrays of the semiconductor light emitting elements 1A can realize a laser processing machine that electrically performs high-speed scanning, for example.

As a method for obtaining intensity distribution and phase distribution from the complex amplitude distribution obtained by inverse Fourier transform, for example, the intensity (amplitude) distribution A(x, y) can be calculated by using an abs function of numerical analysis software "MATLAB" provided by MathWorks, and the phase distribution P(x, y) can be calculated by using an angle function of MATLAB.

Here, points to be noted in the case of obtaining distribution of the rotation angle φ (x, y) from the inverse Fourier transform result of the optical image and performing calculation by using a general discrete Fourier transform (or fast Fourier transform) when determining arrangement of each of the modified refractive index elements 15b will be described below.

If an optical image before subjected to Fourier transform is divided into four quadrants A1, A2, A3, and A4 as illustrated in FIG. 9A, the obtained beam pattern is as illustrated in FIG. 9B. That is, in FIG. 9B, in the first quadrant of the beam pattern, a pattern in which the pattern obtained by rotating the pattern of the first quadrant of FIG. 9A by 180 degrees and the pattern of the third quadrant of FIG. 9A are overlapped appears. In the second quadrant of the beam pattern, a pattern in which the pattern obtained by rotating the pattern of the second quadrant of FIG. 9A by 180 degrees and the pattern of the fourth quadrant of FIG. 9A are overlapped appears. In the third quadrant of the beam pattern, a pattern in which the pattern obtained by rotating the pattern of the third quadrant of FIG. 9A by 180 degrees and the pattern of the first quadrant of FIG. 9A are overlapped appears. In the fourth quadrant of the beam pattern, a pattern in which the pattern obtained by rotating the pattern of the fourth quadrant of FIG. 9A by 180 degrees and the pattern of the second quadrant of FIG. 9A are overlapped appears.

Therefore, in a case where an optical image having a value only in the first quadrant is used as the optical image before subjected to inverse Fourier transform (original optical image) is used, the first quadrant of the original optical image appears in the third quadrant of the obtained beam pattern, and the pattern obtained by rotating the first quadrant of the original optical image by 180 degrees appears in the first quadrant of the obtained beam pattern.

Figure 10:
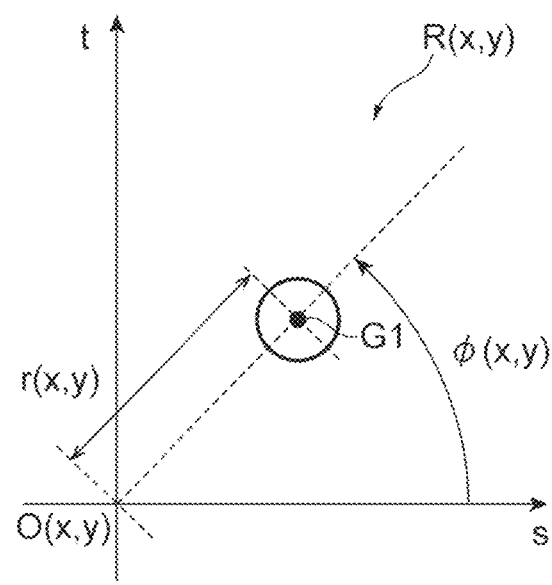
FIG. 10 is a diagram illustrating part of the phase modulation layer in an enlarged manner.
Figure 11:
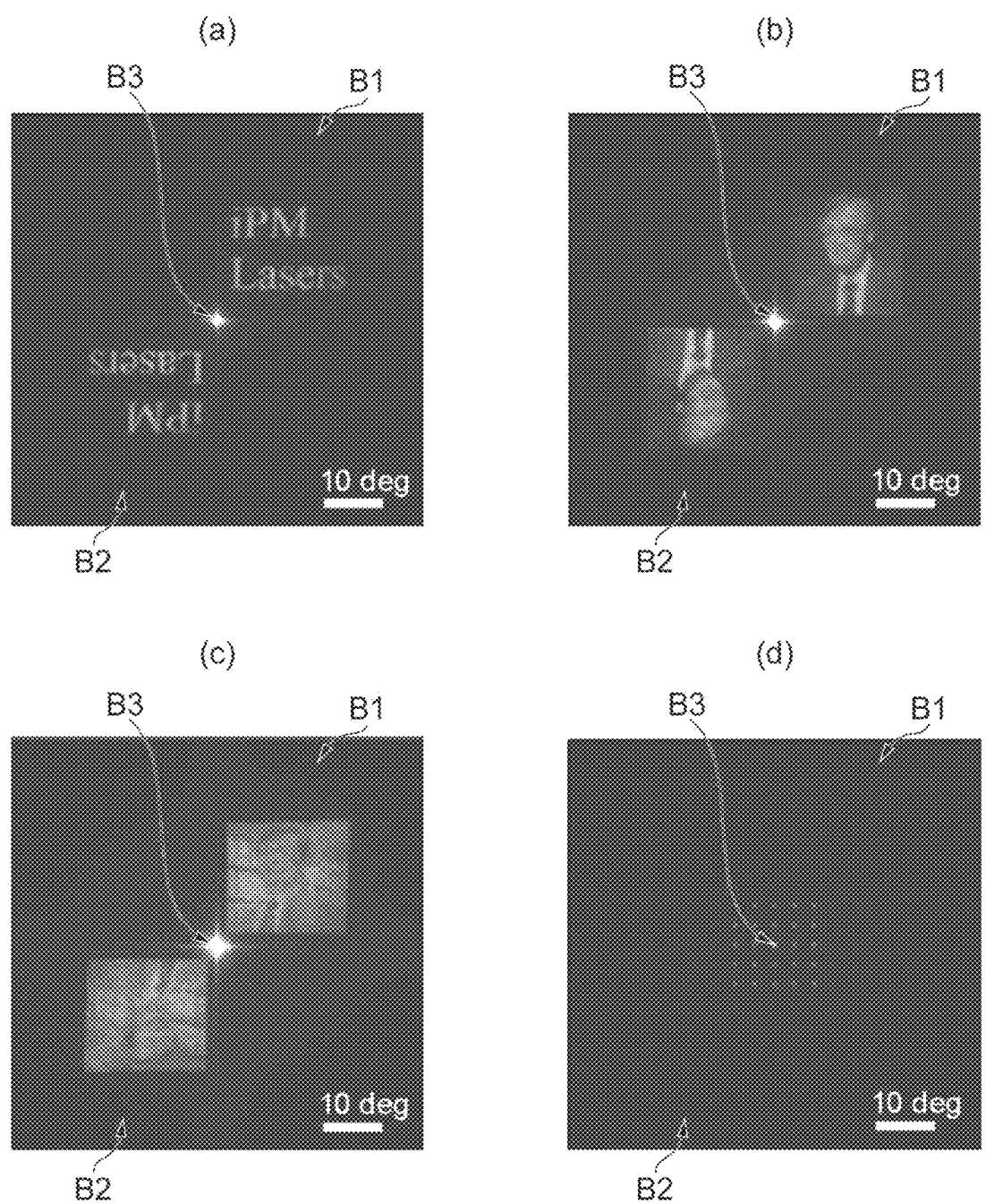
FIGS. 11A to 11D are diagrams illustrating examples of beam patterns (optical images) outputted from the semiconductor light emitting element.

For the purpose of explaining a normal S-iPM laser, FIG. 10 illustrates an example of a case in which one modified refractive index element 15b is provided in each unit constituent region R. FIG. 10 illustrates part of the phase modulation layer (unit constituent region R) in an enlarged manner. FIGS. 11A to 11D are diagrams illustrating examples of beam patterns (optical images) outputted from the semiconductor light emitting element in the example of FIG. 10. The center of each figure corresponds to the axis (Z-axis) along the normal direction of the main surface 10a of the semiconductor substrate 10. As illustrated in FIGS. 11A to 11D, the semiconductor light emitting element outputs +1 order light including a first optical image portion B1 outputted in a first direction inclined with respect to the axis, −1 order light outputted in a second direction symmetric to the first direction with respect to the axis and including a second optical image portion B2 that is rotationally symmetric to the first optical image portion B1 with respect to the axis, and zero-order light B3 traveling on the axis.

As described above, in the phase modulation layer 15A, the center of gravity G2 defined by the N modified refractive index elements 15b as a whole (center of gravity of the modified refractive index region constituted by the N modified refractive index elements 15b assigned to one unit constituent region R) has a rotation angle set for each modified refractive index element 15b around the lattice point O of the imaginary square lattice. In such a case, as compared with a so-called photonic crystal laser in which the center of gravity of the modified refractive index element 15b is located on the lattice point O of the square lattice, light intensity of light (zero-order light B3) outputted in the normal direction to the main surface 10a in the semiconductor substrate 10 is reduced, in other words, light intensity of high order light (for example, +1 order light and −1 order light) outputted in an inclined direction intersecting the normal direction is increased. Furthermore, since the center of gravity G2 defined by the N modified refractive index elements 15b as a whole has a rotation angle according to the optical image, the phase of light can be modulated for each lattice point O. Therefore, according to the semiconductor light emitting element 1A, it is possible to output light for forming an optical image having an arbitrary shape along an inclined direction intersecting the normal direction to the main surface 10a of the semiconductor substrate 10.

Figure 12:
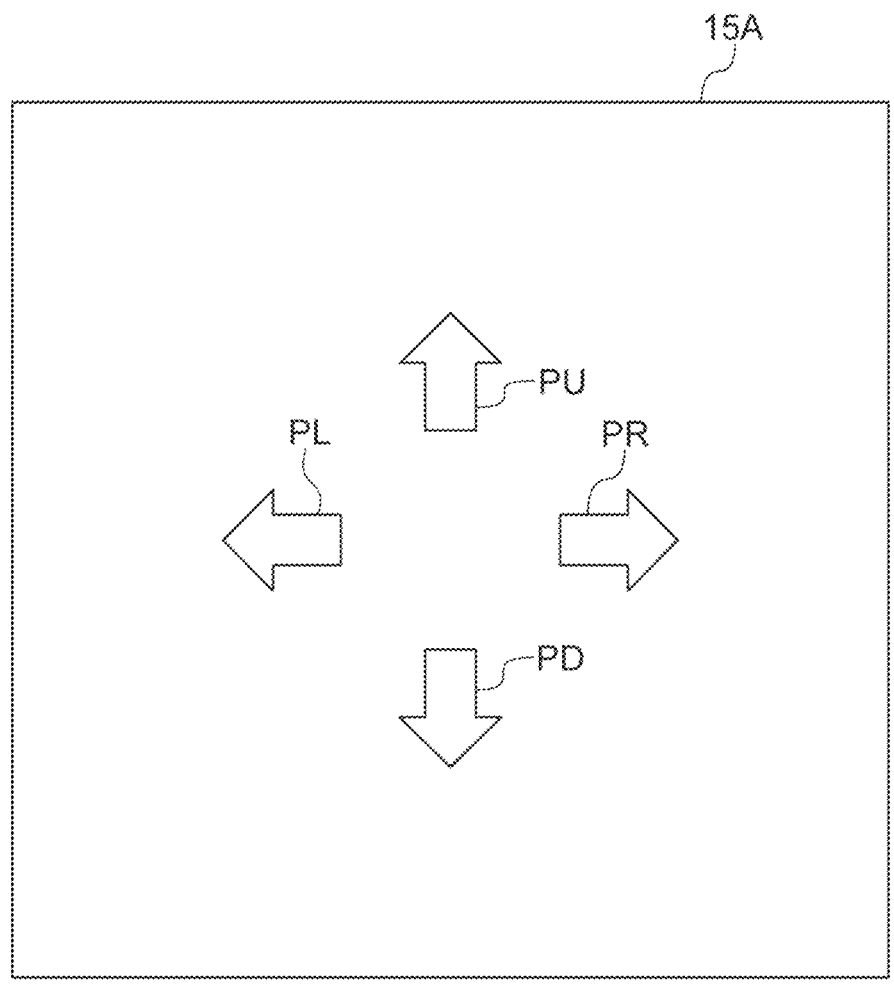
FIG. 12 is a diagram for explaining fundamental light waves in four directions generated in the phase modulation layer.

As illustrated in FIG. 10, a preferable distance between the center of gravity G1 of one modified refractive index element 15b and a lattice point O of an imaginary square lattice in a case where one modified refractive index element 15b is provided for each unit constituent region R will be described. As illustrated in FIG. 12, in the phase modulation layer 15A, fundamental light waves PR, PL, PU, and PD in four directions, that is, the positive and negative directions along one array direction (X-axis) of the square lattice and the positive and negative directions along the other array direction (Y-axis) of the square lattice are generated. The theoretical formulae for the phase differences $\Delta\varphi_R$, $\Delta\varphi_L$, $\Delta\varphi_U$, and $\Delta\varphi_D$ of these fundamental light waves are as expressed by the following Formulae (8) to (11). Note that n is the diffraction order, φ(x, y) is design phase distribution, Jn is an nth-order Bessel function, a is lattice spacing of the imaginary square lattice, and r is the distance between the center of gravity G1 of each modified refractive index element 15b and the corresponding lattice point O (in other words, the length of the vector connecting the lattice point O and the center of gravity G1).

$$\Delta\phi_R(x, y) = \sum_{n=-\infty}^{\infty} e^{-j\frac{n\pi}{2}} J_{-n}\left(\frac{2\pi r}{a}\right) \cdot \exp(in\phi(x, y)) \tag{8}$$

$$\Delta\phi_L(x, y) = \sum_{n=-\infty}^{\infty} e^{-j\frac{n\pi}{2}} J_n\left(\frac{2\pi r}{a}\right) \cdot \exp(in\phi(x, y)) \tag{9}$$

$$\Delta\phi_U(x, y) = \sum_{n=-\infty}^{\infty} J_n\left(\frac{2\pi r}{a}\right) \cdot \exp(in\phi(x, y)) \tag{10}$$

$$\Delta\phi_D(x, y) = \sum_{n=-\infty}^{\infty} J_{-n}\left(\frac{2\pi r}{a}\right) \cdot \exp(in\phi(x, y)) \tag{11}$$

The portions included in the above Formulae (8) to (11), that is, the portions represented by the following Formulae (12) to (15) denote amplitudes of the nth-order diffractions included in these fundamental light waves.

$$e^{-j\frac{n\pi}{2}} J_{-n}\left(\frac{2\pi r}{a}\right) \tag{12}$$

$$e^{-j\frac{n\pi}{2}} J_n\left(\frac{2\pi r}{a}\right) \tag{13}$$

$$J_n\left(\frac{2\pi r}{a}\right) \tag{14}$$

$$J_{-n}\left(\frac{2\pi r}{a}\right) \tag{15}$$

Figure 13:
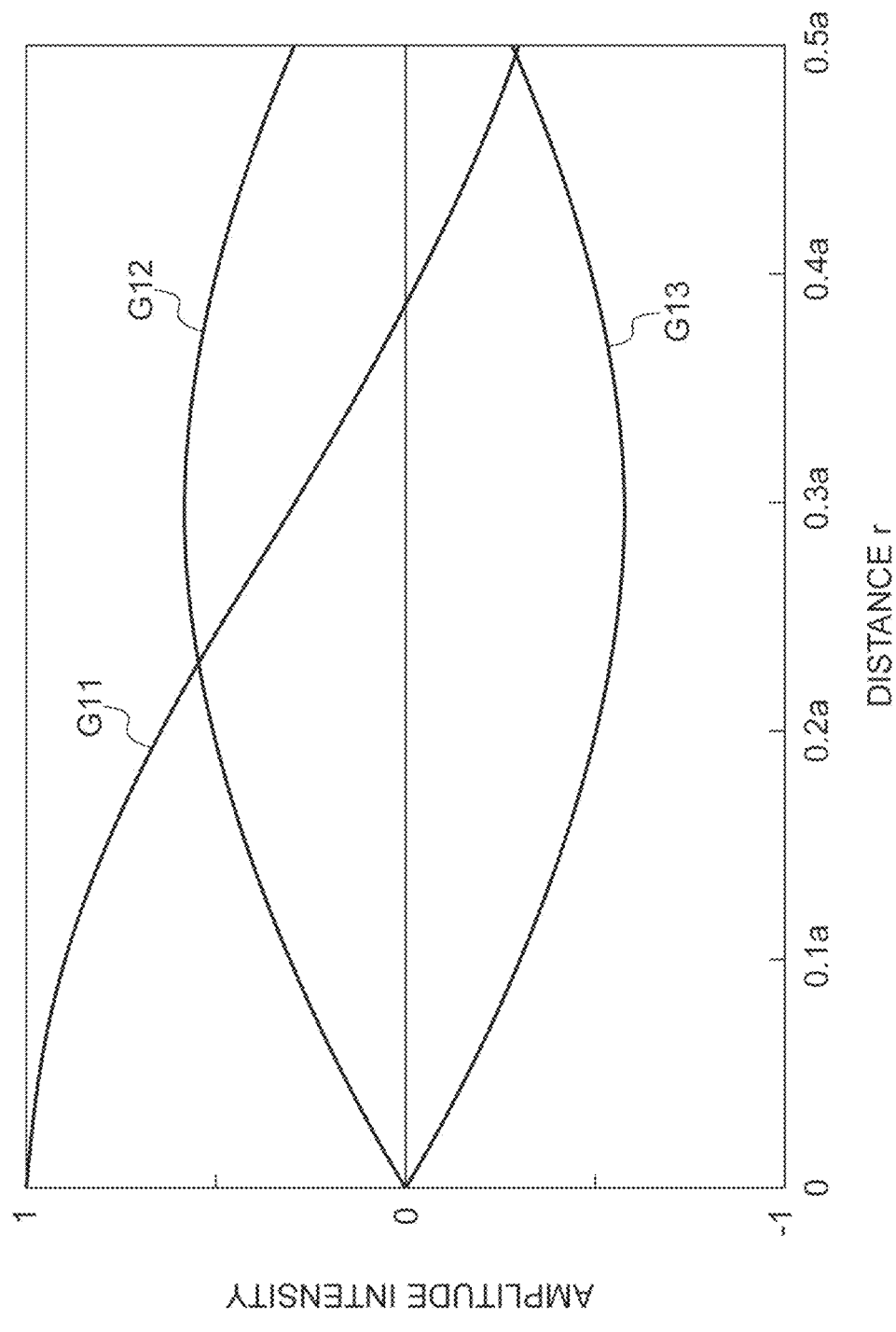
FIG. 13 illustrates graphs depicting the relationships between amplitude intensities of zero-order diffracted light, +1 order diffracted light, and −1 order diffracted light, and the distance from a lattice point to the center of gravity of each of the corresponding modified refractive index elements.
Figure 14:
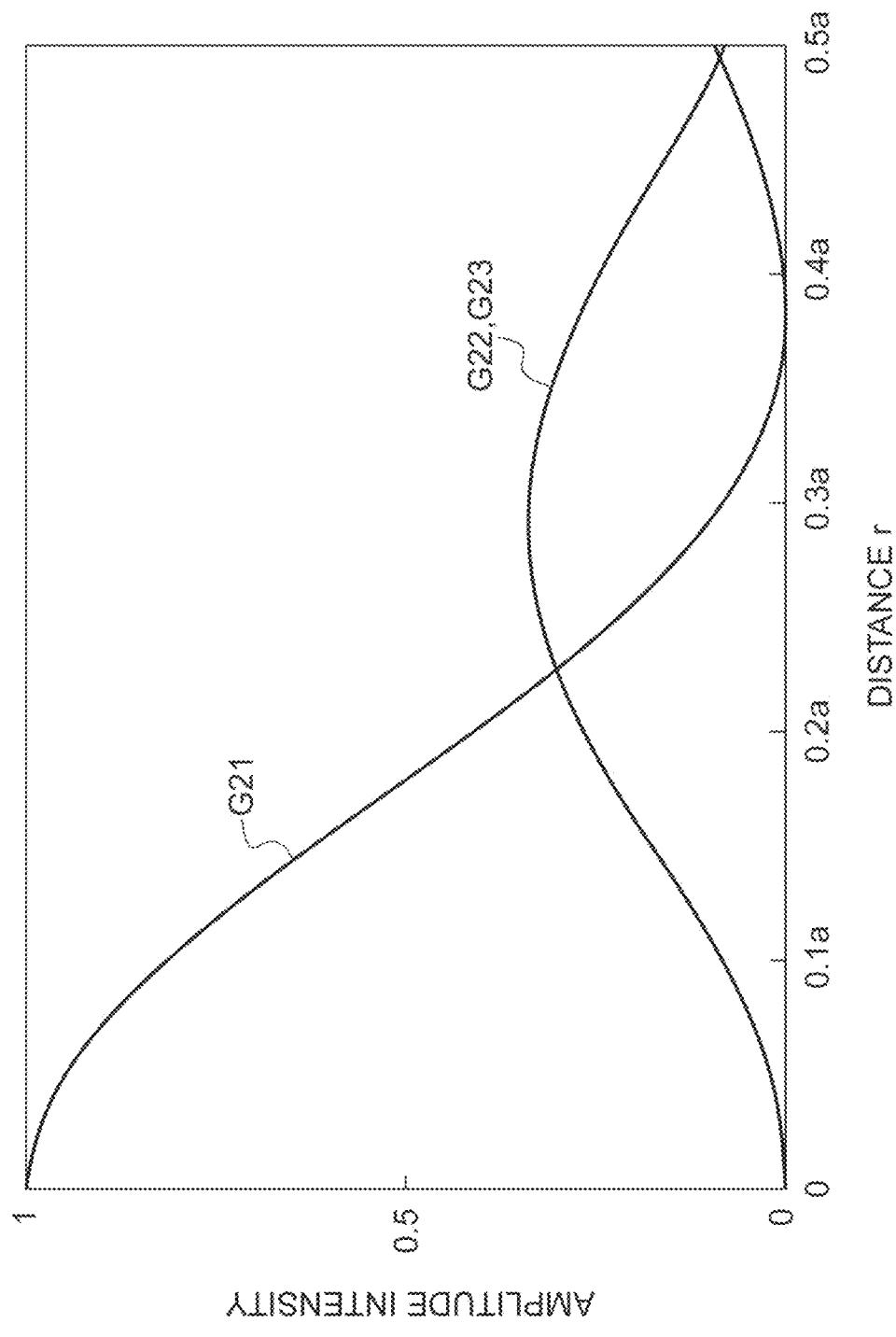
FIG. 14 illustrates graphs depicting square values of the graphs illustrated in FIG. 13.

FIG. 13 illustrates graphs depicting the relationships between the distance r and the amplitudes of zero-order diffracted light, +1 order diffracted light, and −1 order diffracted light. A graph G11 depicts zero-order diffracted light, a graph G12 depicts +1 order diffracted light, and a graph G13 depicts −1 order diffracted light. In addition, graphs G21 to G23 in FIG. 14 depict intensities (proportional to the square of the amplitude) of the graphs G11 to G13 illustrated in FIG. 13, respectively. Note that in FIGS. 13 and 14, the horizontal axis represents the distance r, and the vertical axis represents the amplitude and intensity (value normalized assuming that the value obtained when the distance r=0 is 1). In FIG. 14, since the graphs G22 and G23 are completely in agreement, the graphs G22 and G23 are illustrated so as to overlap with each other.

As depicted by the graphs G11 and G21, the amplitude and intensity of the zero-order diffracted light are smaller as the distance r is greater (that is, as the center of gravity G1 is farther from the lattice point O). Then, within the range in which the distance r is greater than 0.3a and not greater than 0.50a, intensity of the zero-order diffracted light becomes a small value such as about 10% or less of the intensity in the case of the distance r=0, and is sufficiently suppressed. In addition, within the range in which the distance r is equal to or greater than 0.341a and not greater than 0.429a, intensity of the zero-order diffracted light becomes an extremely small value such as about 2% or less of the intensity in the case of the distance r=0, and is further sufficiently suppressed. In particular, in a case where the distance r is 0.38a or a value close to 0.38a, intensity of the zero-order diffracted light is nearly 0, and is most effectively suppressed. Note that 0.38a corresponds to the value of r in a case where the zero-order Bessel function J0(2πr/a)=0 is satisfied.

Note that the trends illustrated in FIGS. 13 and 14 do not depend on various variables such as the planar shape and size of the modified refractive index element 15b, the number of modified refractive index elements 15b in each unit constituent region R, the type of semiconductor material, the layer structure, and thickness of each layer. The trends illustrated in FIGS. 13 and 14 are common to all iPM lasers of the type in which the corresponding modified refractive index element 15b rotates around the lattice point O.

Referring back to FIG. 5. In the present embodiment, the distance $r_1$ between the center of gravity G1 of each modified refractive index element 15b and the corresponding lattice point O is identical in each of the N modified refractive index elements 15b. In other words, the respective centers of gravity G1 of the N modified refractive index elements 15b are located on a circle CR having a radius $r_1$ centered on the corresponding lattice point O. Then, in the case of N=2, the centers of gravity G1 of the N modified refractive index elements 15b are arranged at positions that are not point-symmetric with respect to the corresponding lattice point O. That is, the vector connecting the lattice point O and the center of gravity G1 of one modified refractive index element 15b and the vector connecting the lattice point O and the center of gravity G1 of the other modified refractive index element 15b form an angle smaller than 180°. This is to make the center of gravity G2 defined by the modified refractive index elements 15b as a whole (center of gravity of the modified refractive index region constituted by the modified refractive index elements 15b existing in one unit constituent region R) not overlap with the lattice point O (that is, to make the distance $r_2$ greater than 0). In other words, in each unit constituent region R, the center of gravity G2 defined by the modified refractive index elements 15b as a whole is arranged away from the lattice point O closest to the center of gravity G2. Note that in the present embodiment, the N modified refractive index elements 15b may have an identical planar shape (for example, a circular shape) or may have different planar shapes. However, the areas of the N modified refractive index elements 15b on the X-Y plane are identical to each other.

Next, a preferable distance between the center of gravity G2 defined by the modified refractive index elements 15b as a whole and the lattice point O of the imaginary square lattice will be described. The graphs G22 and G23 of FIG. 14 depict intensities of the +1 order diffracted light and the −1 order diffracted light, respectively. At this time, in a case where there is a plurality of the modified refractive index elements 15b, the distance $r_2$ between the center of gravity G2 and the lattice point O may be replaced with the above r. Referring to the graphs G22 and 23 in FIG. 14, it can be seen that if the distance r exceeds 0.30a, the +1-order diffracted light and the −1 order diffracted light are weakened and the efficiency is lowered. Therefore, in a case where one modified refractive index element 15b is provided in each unit constituent region R, a threshold current increases if the distance r increases. Therefore, the distance $r_2$ between the center of gravity G2 and the corresponding lattice point O is preferably not greater than 0.30a.

Note that in the structure described above, the material, the thickness, and the layer structure can be variously changed as long as the structure includes the active layer 12 and the phase modulation layer 15A. Here, a scaling law holds for so-called square lattice photonic crystal lasers in a case where perturbation from the imaginary square lattice is zero. That is, in a case where the wavelength becomes a constant α times, a similar standing wave state can be obtained by multiplying the square lattice structure as a whole by α times. Similarly, also in the present embodiment, it is possible to determine the structure of the phase modulation layer 15A according to the scaling law corresponding to the wavelength. Therefore, it is also possible to realize the semiconductor light emitting element 1A that outputs visible light by using the active layer 12 that emits light in blue, green, red, and the like and applying a scaling law according to the wavelength.

When the semiconductor light emitting element 1A is manufactured, a metal organic chemical vapor deposition (MOCVD) method or a molecular beam epitaxy method (MBE) is applied to growth of each compound semiconductor layer. In manufacturing of the semiconductor light emitting element 1A using AlGaAs, the growth temperature of AlGaAs is 500° C. to 850° C., and 550 to 700° C. was adopted in the experiment. During growth, TMA (trimethylaluminium) is used as an Al raw material, TMG (trimethylgallium) and TEG (triethylgallium) are used as a gallium raw material, $AsH_3$ (arsine) is used as an As raw material, $Si_2H_6$ (disilane) is used as a raw material for an n-type impurity, DEZn (diethyl zinc) is used as a raw material for a p-type impurity. In growth of GaAs, TMG and arsine are used, but TMA is not used. InGaAs is manufactured by using TMG TMI (trimethylindium), and arsine. An insulating film can be formed by sputtering a target using the constituent material thereof as a raw material or by a PCVD (plasma CVD) method.

That is, in the above-described semiconductor light emitting element 1A, first, on a GaAs substrate as the n-type semiconductor substrate 10, the AlGaAs layer as the n-type cladding layer 11, the InGaAs/AlGaAs multiple quantum well structure as the active layer 12, the GaAs layer as the base layer 15a of the phase modulation layer 15A are sequentially epitaxially grown by using a MOCVD (metal organic chemical vapor deposition) method.

Next, another resist is applied to the base layer 15a. A two-dimensional fine pattern is drawn on the resist by an electron beam drawing device with an alignment mark as a reference. Then, the drawn resist is developed to form a two-dimensional fine pattern on the resist. Thereafter, the two-dimensional fine pattern is transferred onto the base layer 15a by dry etching using the resist as a mask. That is, the resist is removed after holes are formed in the base layer 15a. Note that a SiN layer or a $SiO_2$ layer may be formed on the base layer 15a by the PCVD method before the resist is formed. Furthermore, after a resist mask is formed on the SiN layer or the $SiO_2$ layer, a fine pattern may be transferred on the SiN layer or the $SiO_2$ layer by using reactive ion etching (RIE). Note that the SiN layer or the $SiO_2$ layer is dry-etched after the resist is removed. In this case, resistance to dry etching can be increased. These holes are used as the modified refractive index elements 15b, or a compound semiconductor (AlGaAs) serving as the modified refractive index elements 15b is regrown in the holes to a depth not less than the depth of the holes. In a case where the hole is the modified refractive index element 15b, a gas such as air, nitrogen, or argon may be enclosed in the hole. Next, the AlGaAs layer as the cladding layer 13 and the GaAs layer as the contact layer 14 are sequentially formed by using MOCVD. The electrodes 16 and 17 are formed by a vapor deposition method or a sputtering method. In addition, if necessary, the protective film 18 and the antireflection film 19 are formed by sputtering, the PCVD method, or the like.

Note that in a case where the phase modulation layer 15A is provided between the active layer 12 and the cladding layer 11, the phase modulation layer 15A may be formed on the cladding layer 11 before the active layer 12 is formed. In addition, the lattice spacing a of the imaginary square lattice is about the value obtained by dividing the wavelength by the equivalent refractive index, and is set to about 300 nm, for example.

Note that in the case of the square lattice with the lattice spacing a, assuming that the unit vectors of the orthogonal coordinates are x and y, primitive translation vectors $a_1=ax$ and $a_2=ay$, and primitive reciprocal lattice vectors $b_1=(2\pi/a)x$ and $b_2=(2\pi/a)y$ with respect to the translation vectors $a_1$ and $a_2$. In a case where the wavenumber vector of the wave existing in the lattice is $k=nb_1+mb_2$ (n and m are arbitrary integers), the wavenumber k exists at the F point, and in a case where the magnitude of the wavenumber vector is equal to the magnitude of the primitive reciprocal lattice vector, a resonance mode (standing wave on the X-Y plane) in which the lattice spacing a is equal to the wavelength $\lambda$ is obtained. In the present embodiment, oscillation in such a resonance mode (standing wave state) is obtained. At this time, considering a TE mode in which an electric field exists in a plane parallel to the square lattice, there are four modes in the standing wave state in which the lattice spacing and the wavelength are equal to each other due to symmetry of the square lattice. In the present embodiment, a desired beam pattern can be obtained in a similar manner as in the case of oscillating in any mode of these four standing wave states.

Note that a desired beam pattern is obtained because the standing wave in the above-described phase modulation layer 15A is scattered by the hole shape and the wavefront obtained in the direction perpendicular to the plane is phase-modulated. This beam pattern is not only a pair of unimodal beams (spots), but as described above, may be a letter shape, a group of two or more spots of an identical shape, or a vector beam in which the phase and intensity distributions are spatially non-uniform.

Note that the base layer 15a preferably has a refractive index of 3.0 to 3.5, and the modified refractive index element 15b preferably has a refractive index of 1.0 to 3.4. In addition, the average radius of the modified refractive index elements 15b in the holes of the base layer 15a is, for example, 20 nm to 120 nm in the case of a 940 nm band. Diffraction intensity in the Z-axis direction changes according to a change in size of each modified refractive index element 15b. This diffraction efficiency is proportional to an optical coupling coefficient κ1 expressed by a linear coefficient in a case where the shape of the modified refractive index element 15b is subjected to Fourier transform. The optical coupling coefficient is described in, for example, the above Non-Patent Document 3.

The effects obtained by the semiconductor light emitting element 1A of the present embodiment described above are as follows. In the present embodiment, each of the centers of gravity G1 of the N modified refractive index elements 15b provided in one unit constituent region R is arranged apart from the corresponding lattice point O of the imaginary square lattice, and has a rotation angle around the lattice point O according to the optical image. With such a structure, it is possible to output light for forming an optical image having an arbitrary shape along an inclined direction intersecting the normal direction to the main surface 10a of the semiconductor substrate 10. In addition, in the present embodiment, the distance $r_1$ between each of the centers of gravity G1 of the N modified refractive index elements 15b and the corresponding lattice point O is greater than 0.30 times and not greater than 0.50 times of the lattice spacing a. As described with reference to FIGS. 13 and 14, since the distance $r_1$ is within such a range, it is possible to effectively reduce the zero-order light included in output of the S-iPM laser. Furthermore, in the present embodiment, the distance $r_2$ between the center of gravity G2 defined by the N modified refractive index elements 15b as a whole and the corresponding lattice point O is greater than 0 and not greater than 0.30 times of the lattice spacing a. As described above, since the distance $r_2$ is within such a range, it is possible to provide a practical S-iPM laser in which the S/N ratio of the output beam pattern is reduced. In addition, since the distance $r_2$ is greater than 0, that is, the lattice point O and the center of gravity G2 do not coincide with each other, it is possible to prevent the +1 order lights from weakening each other due to vanishing interference.

In addition, as described above, the distance $r_1$ may be 0.38 times of the lattice spacing a. As described with reference to FIGS. 13 and 14, since the distance $r_1$ is 0.38 times of the lattice spacing a, the zero-order light included in output of the S-iPM laser can be brought close to zero.

In addition, as described above, in a case where two modified refractive index elements 15b are provided in each unit constituent region R, the two modified refractive index elements 15b are arranged such that the centers of gravity G1 of the two modified refractive index elements 15b are not point-symmetric with respect to the corresponding lattice point O. For example, with such a configuration, the center of gravity G2 defined by the N modified refractive index elements 15b can be arranged away from the corresponding lattice point O.

(First Modification)

Figure 15:
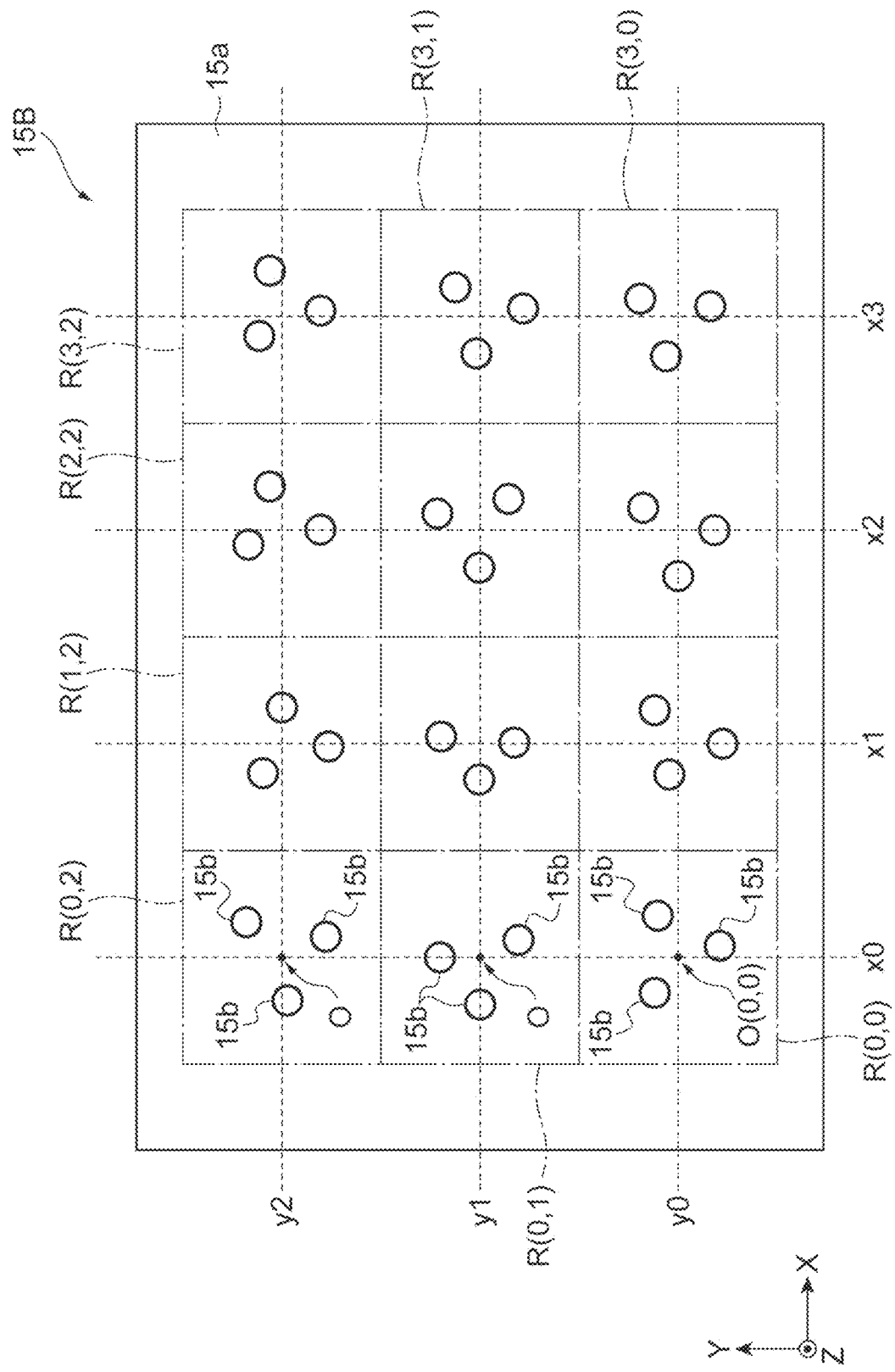
FIG. 15 is a plan view illustrating a phase modulation layer according to a first modification.
Figure 16:
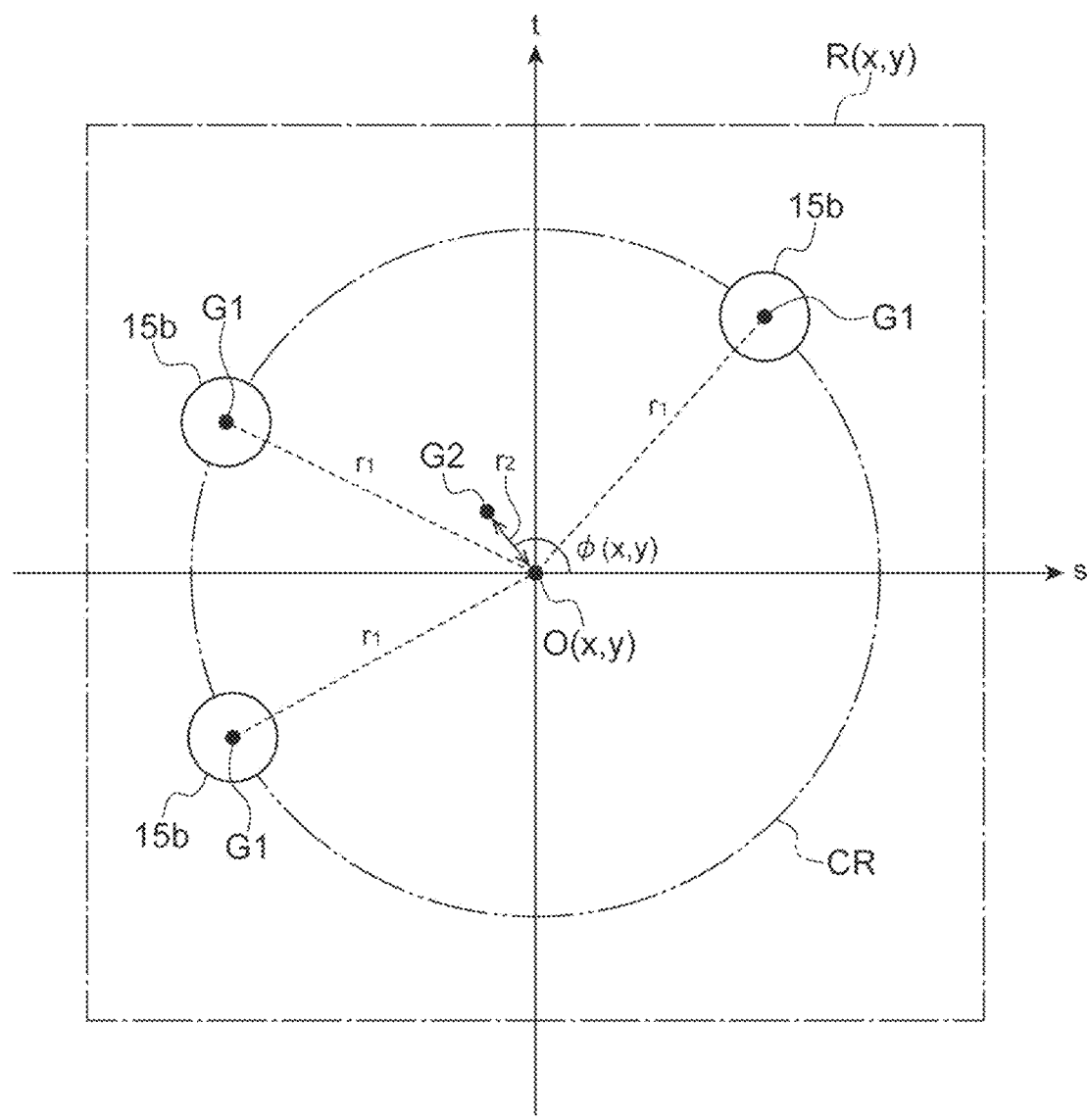
FIG. 16 is a diagram illustrating the phase modulation layer according to the first modification in an enlarged manner.

FIG. 15 is a plan view illustrating a phase modulation layer 15B according to a modification of the above-described embodiment. Setting a unit constituent region R illustrated in FIG. 15 is identical to setting in FIG. 4. FIG. 16 is diagram illustrating the phase modulation layer 15B in an enlarged manner, and illustrating a certain unit constituent region R. The configuration of each of the other unit constituent regions R is similar to this. The phase modulation layer 15A of the above-described embodiment may be replaced with the phase modulation layer 15B of the present modification.

FIGS. 15 and 16 illustrate a case where N=3 in each unit constituent region R. Then, similarly to the above-described embodiment, the distance $r_1$ between center of gravity G1 of each of modified refractive index elements 15b and a corresponding lattice point O is identical in each of the N modified refractive index elements 15b. In other words, the respective centers of gravity G1 of the three modified refractive index elements 15b are located on a circle having a radius $r_1$ centered on the corresponding lattice point O. Then, in the case of N≥3, the respective centers of gravity G1 of the N modified refractive index elements 15b are arranged around the corresponding lattice point O at mutually different spacing. That is, in one unit constituent region R, the vectors connecting the lattice point O and the centers of gravity G1 of the three modified refractive index elements 15b form angles different from (360/N°). This is to prevent the center of gravity G2 defined by the N modified refractive index elements 15b as a whole from overlapping with the lattice point O (that is, the distance $r_2$ is greater than 0). Note that, also in the present modification, the N modified refractive index elements 15b may have an identical planar shape (for example, a circular shape) or may have different planar shapes. However, the areas of the N modified refractive index elements 15b on the X-Y plane are identical to each other.

Even with the configuration of the phase modulation layer as in the present modification, the effects of the above-described embodiment can be suitably exhibited. In addition, as in the present modification, three or more modified refractive index elements 15b may be provided in each of the unit constituent region R (where the lattice point O is located at the center) that constitutes an imaginary square lattice. As a result, the area per one modified refractive index element 15b can be reduced. In addition, it is possible to expect an effect of suppressing coalescence of a modified refractive index element 15b with a modified refractive index element 15b in an adjacent unit constituent element due to spread of the modified refractive index element 15b caused by a manufacturing error or the like.

(Second Modification)

Figure 17:
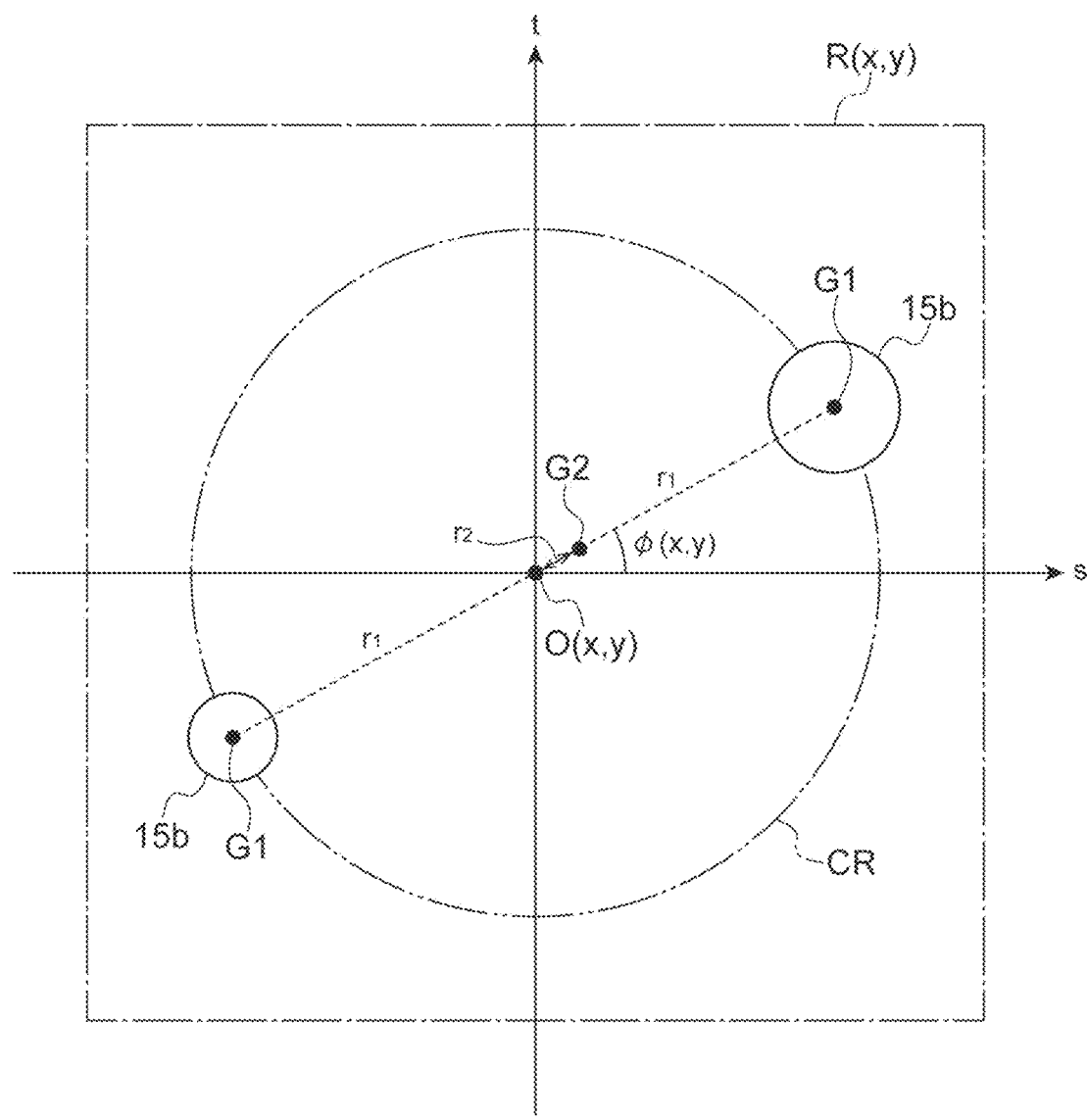
FIG. 17 is a plan view illustrating a phase modulation layer according to a second modification in an enlarged manner.
Figure 18:
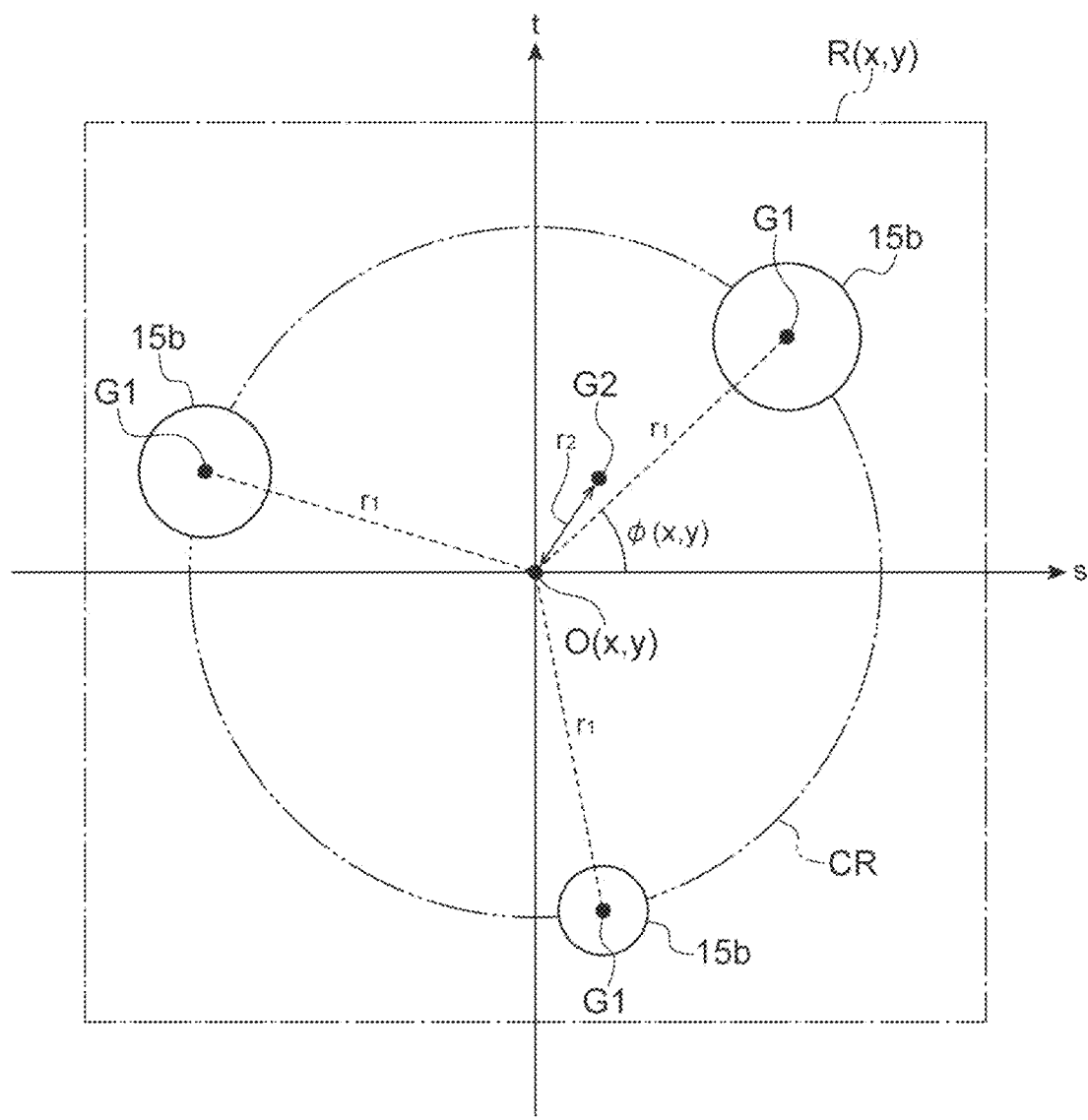
FIG. 18 is a plan view illustrating the phase modulation layer according to the second modification in an enlarged manner.

FIGS. 17 and 18 are plan views illustrating a phase modulation layer according to a modification of the above-described embodiment in an enlarged manner and illustrating a certain unit constituent region R. Note that the configuration of each of the other unit constituent regions R is similar to this.

In the present modification, areas in the X-Y plane of at least two modified refractive index elements 15b of the N modified refractive index elements 15b provided in each of the unit constituent regions R are different from each other. FIG. 17 illustrates, as an example, an example in which two modified refractive index elements 15b are provided in each unit constituent region R and the areas of these modified refractive index elements 15b are different from each other. In addition, FIG. 18 illustrates, as another example, an example in which three modified refractive index elements 15b are provided in each unit constituent region R and the areas of these modified refractive index elements 15b are different from one another.

As described above, since the areas of the modified refractive index elements 15b are different from one another, it is possible to prevent a center of gravity G2 defined by the modified refractive index elements 15b as a whole from overlapping with a lattice point O (that is, to make a distance $r_2$ greater than 0). The N modified refractive index elements 15b may have an identical planar shape (for example, a circular shape) or may have different planar shapes.

Note that in the present modification, a distance $r_1$ between the center of gravity G1 of each modified refractive index element 15b located in one unit constituent region R and the corresponding lattice point O may be identical in each of the N modified refractive index elements 15b. In other words, the respective centers of gravity G1 of the N modified refractive index elements 15b are located on the circle having a radius $r_1$ centered on the corresponding lattice point O. Then, in the case of N=2, the centers of gravity G1 of the N modified refractive index elements 15b may be arranged at locations point-symmetric with respect to the corresponding lattice point O. That is, the angle between the vector connecting the lattice point O and the center of gravity G1 of one modified refractive index element 15b and the vector connecting the lattice point O and the center of gravity G1 of the other modified refractive index element 15b may be 180°. In addition, in the case of N≥3, the respective centers of gravity G1 of the N modified refractive index elements 15b may be arranged around the corresponding lattice point O at equal spacing. That is, the vectors connecting the lattice point O and the respective centers of gravity G1 of the modified refractive index elements 15b may form angles (360/N°).

(Third Modification)

Figure 19:
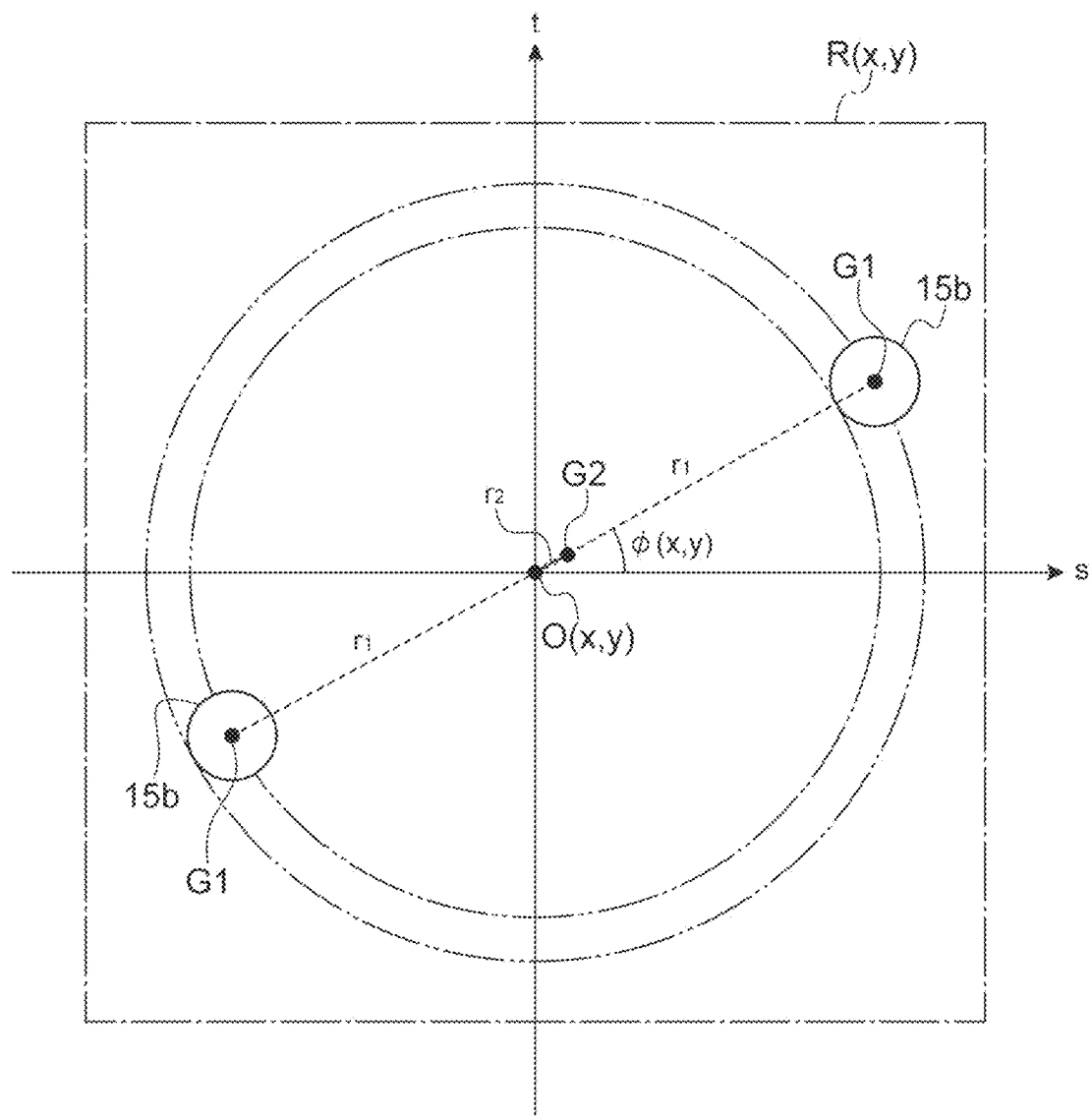
FIG. 19 is a plan view illustrating a phase modulation layer according to a third modification in an enlarged manner.
Figure 20:
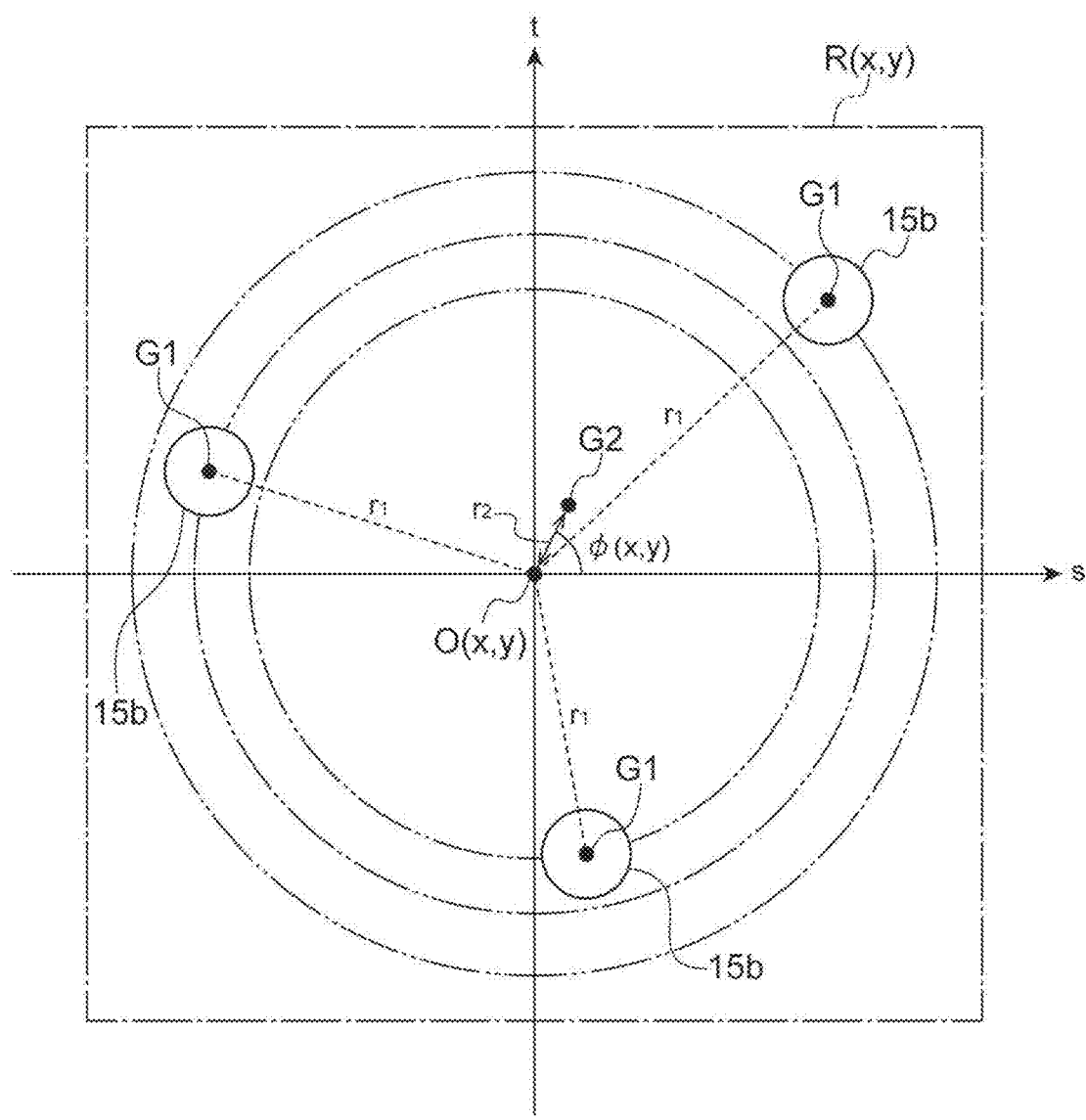
FIG. 20 is a plan view illustrating the phase modulation layer according to the third modification in an enlarged manner.

FIGS. 19 and 20 are plan views illustrating a phase modulation layer according to a modification of the above-described embodiment in an enlarged manner and illustrating a certain unit constituent region R. Note that the configuration of each of the other unit constituent regions R is similar to this.

In the present modification, distances $r_1$ between a lattice point O and centers of gravity G1 of at least two modified refractive index elements 15b among N modified refractive index elements 15b provided in each unit constituent region R differ from each other. FIG. 19 illustrates, as one example, an example in which two modified refractive index elements 15b are provided in each unit constituent region R and distances $r_1$ between the lattice point O and the centers of gravity G1 of these modified refractive index elements 15b differ from each other. In addition, FIG. 20 illustrates, as another example, an example in which three modified refractive index elements 15b are provided in each unit constituent region R and distances $r_1$ between the lattice point O and the centers of gravity G1 of these modified refractive index elements 15b differ from one another. In other words, in one unit constituent region R, the centers of gravity G1 of the N modified refractive index elements 15b are located on circles having different radii with the corresponding lattice point O as the center.

As described above, since the distances $r_1$ between the corresponding lattice point O and the centers of gravity G1 of at least two modified refractive index elements 15b of the N modified refractive index elements 15b in one unit constituent region R differ from each other, it is possible to prevent the center of gravity G2 defined by the modified refractive index elements 15b as a whole from overlapping with the corresponding lattice point O (that is, to make a distance $r_2$ greater than 0). In particular, it is more preferable to set the distances $r_1$ from the lattice point O to the N modified refractive index elements 15b so that the average of the distances $r_1$ approaches 0.38a because zero-order light of the N modified refractive index elements 15b cancels out each other.

The N modified refractive index elements 15b may have an identical planar shape (for example, a circular shape) or may have different planar shapes. However, the areas of the N modified refractive index elements 15b on the X-Y plane are identical to each other. In addition, in the case of N=2, the angle between the vector connecting the lattice point O and the center of gravity G1 of one modified refractive index element 15b and the vector connecting the lattice point O and the center of gravity G1 of the other modified refractive index element 15b may be 180°. In addition, the case of N≥3, the vectors connecting the lattice point O and the respective centers of gravity G1 of the modified refractive index elements 15b may form angles (360/N°).

(Fourth Modification)

Figure 21:
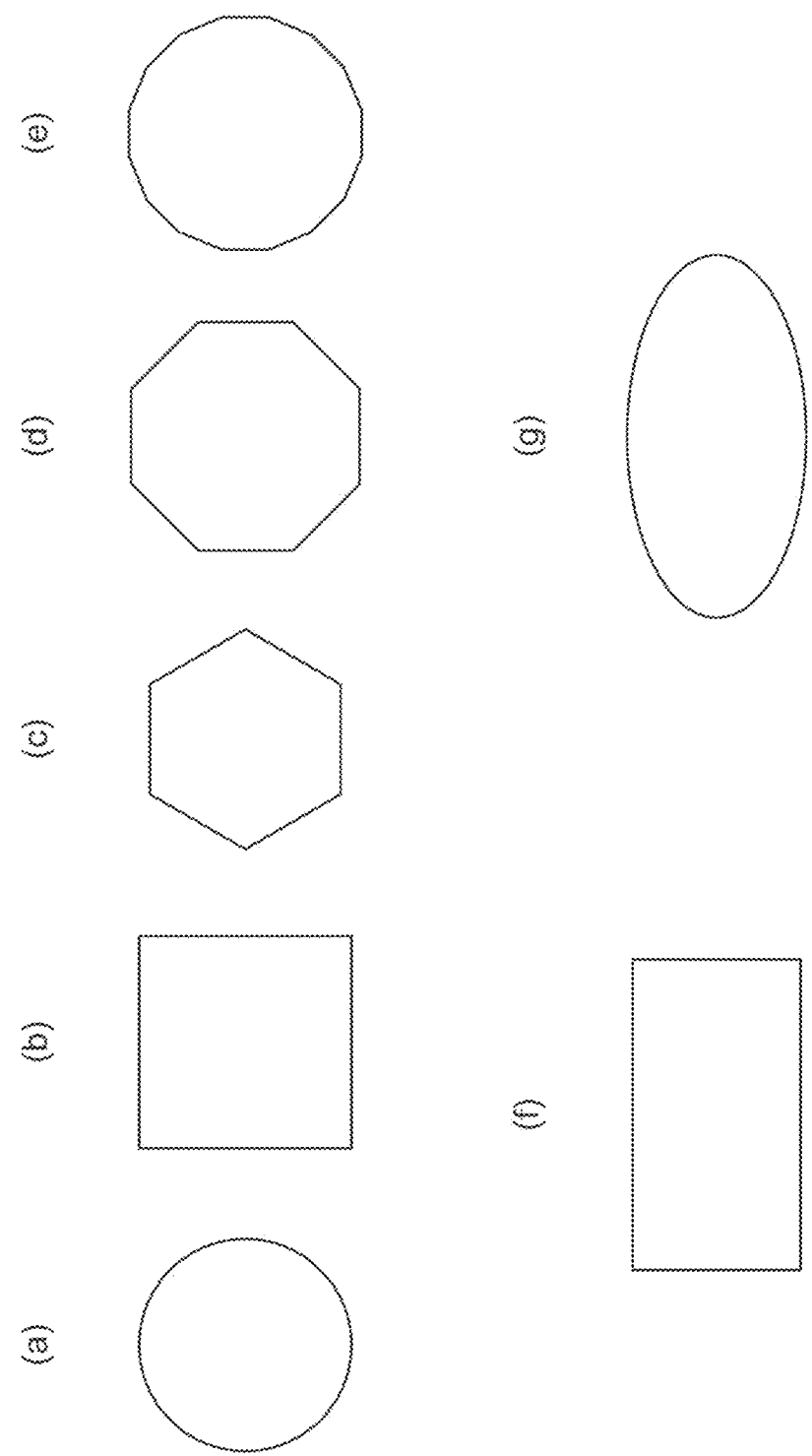
FIGS. 21A to 21G are plan views illustrating examples of the shape of the modified refractive index element in an X-Y plane.
Figure 22:
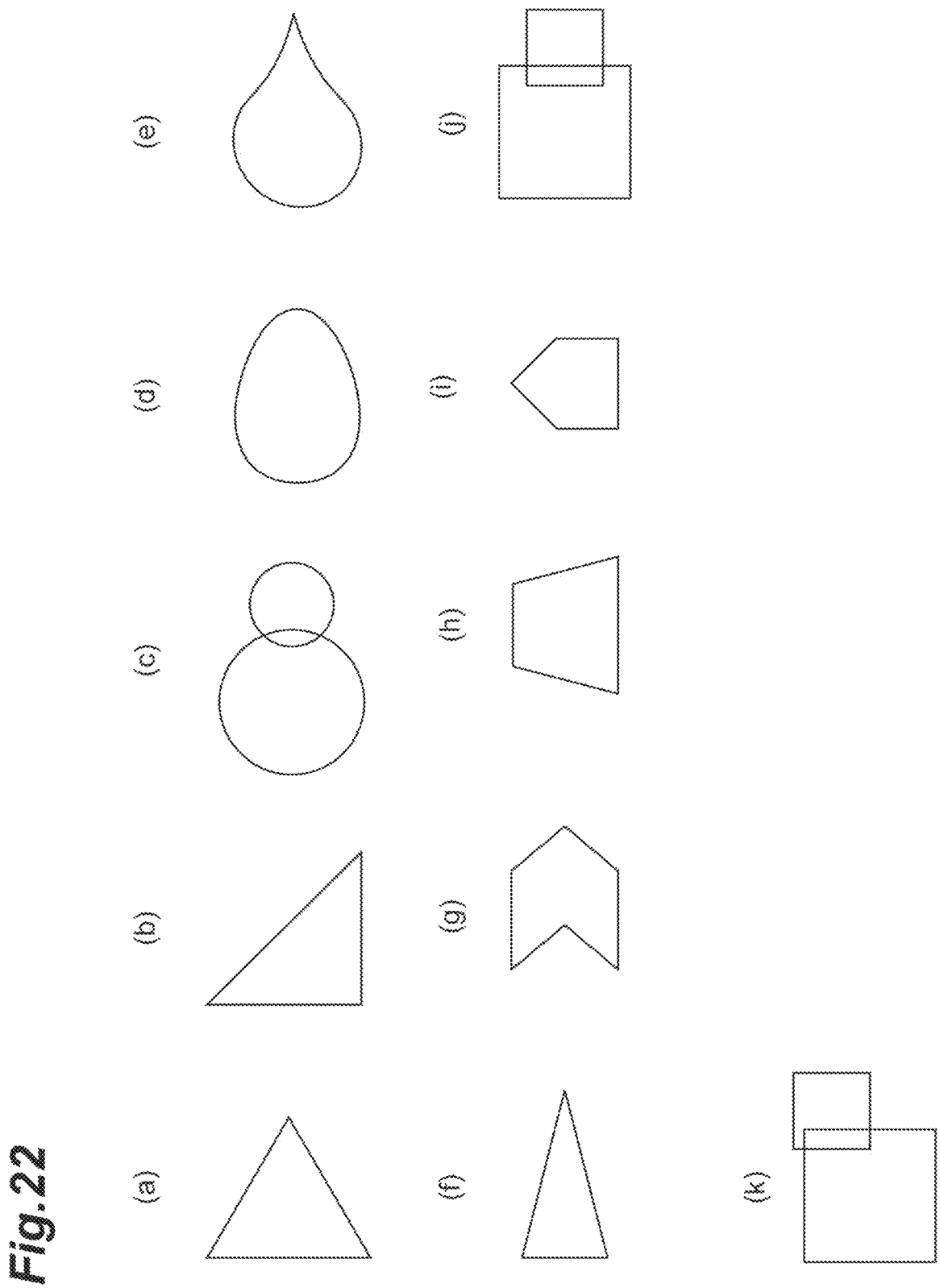
FIGS. 22A to 22K are plan views illustrating examples of the shape of the modified refractive index element in the X-Y plane.

FIGS. 21A to 21G and 22A to 22K are plan views illustrating examples of the shape of each modified refractive index element 15b in an X-Y plane. In the embodiment and each modification described above, examples in which the modified refractive index element 15b has a circular shape on the X-Y plane have been described. However, a modified refractive index element 15b may have a shape other than a circle. For example, the shape of a modified refractive index element 15b on the X-Y plane may have mirror image symmetry (line symmetry). Here, the mirror image symmetry (line symmetry) means that the planar shape of a modified refractive index element 15b located on one side with respect to a certain straight line along the X-Y plane and the planar shape of a modified refractive index element 15b located on the other side with respect to the straight line can be mirror-symmetric (line-symmetric) to each other. Examples of the shape having mirror image symmetry (line symmetry) include a perfect circle illustrated in FIG. 21A, a square illustrated in FIG. 21B, a regular hexagon illustrated in FIG. 21C, a regular octagon illustrated in FIG. 21D, a regular 16-sided polygon illustrated in FIG. 21E, a rectangle illustrated in FIG. 21F, and an ellipse illustrated in FIG. 21G As described, the shape of the modified refractive index element 15b on the X-Y plane has mirror image symmetry (line symmetry). In this case, since the shape of the modified refractive index element 15b in each of the unit constituent regions R of the imaginary square lattice of the phase modulation layer 15A has a simple shape, the direction and position of the center of gravity G1 of the corresponding modified refractive index element 15b from the lattice point O can be accurately determined. Therefore, patterning can be performed with high accuracy.

In addition, the shape of the modified refractive index element 15b on the X-Y plane may be a shape which does not have rotational symmetry of 180°. Examples of such a shape include an equilateral triangle illustrated FIG. 22A, an isosceles triangle illustrated in FIG. 22B, a shape where portions of two circles or ellipses overlap with each other illustrated in FIG. 22C, an oval shape illustrated in FIG. 22D, a teardrop shape illustrated in FIG. 22E, an isosceles triangle illustrated in FIG. 22F, an arrow shape illustrated in FIG. 22G, a trapezoid illustrated in FIG. 22H, a pentagon illustrated in FIG. 22I, a shape in which portions of two rectangles overlap with each other illustrated in FIG. 22J, and a shape in which portions of two rectangles overlap with each other and which does not have mirror image symmetry illustrated in FIG. 22K. Note that the oval shape is a shape that is deformed so that the dimension in the minor axis direction near one end along the major axis of the ellipse is smaller than the dimension in the minor axis direction near the other end. The teardrop shape is a shape in which one end along the major axis of the ellipse is deformed into a sharp end protruding along the major-axis direction. The arrow shape is a shape in which one side of a rectangle is recessed in a triangular shape and the opposite side is sharpened in a triangular shape. As described above, since the modified refractive index element 15b on the X-Y plane does not have the rotational symmetry of 180°, higher light output can be obtained.

FIGS. 23A to 23K are plan views illustrating other examples of the shape of the modified refractive index element (constituted by a plurality of modified refractive index elements arranged in one unit constituent region R) on the X-Y plane. In each of the examples, a plurality of modified refractive index elements 15c different from the modified refractive index element 15b is further provided. Each of the modified refractive index elements 15c is comprised of a second refractive index medium having a refractive index different from the refractive index of the base layer 15a (first refractive index medium). Similarly to the modified refractive index element 15b, the modified refractive index element 15c may be a hole, or a compound semiconductor may be embedded in the hole. The modified refractive index elements 15c are provided in a one-to-one correspondence with the modified refractive index elements 15b. Then, the center of gravity of the modified refractive index element 15b and the modified refractive index element 15c corresponds to the above-described center of gravity G1 (center of gravity of each modified refractive index element). Note that any of the modified refractive index elements 15b and 15c are included in the range of the unit constituent region R that constitutes the imaginary square lattice. The unit constituent region R is a region surrounded by straight lines each of which bisects the interval between the lattice points of the imaginary square lattice.

Figure 23:
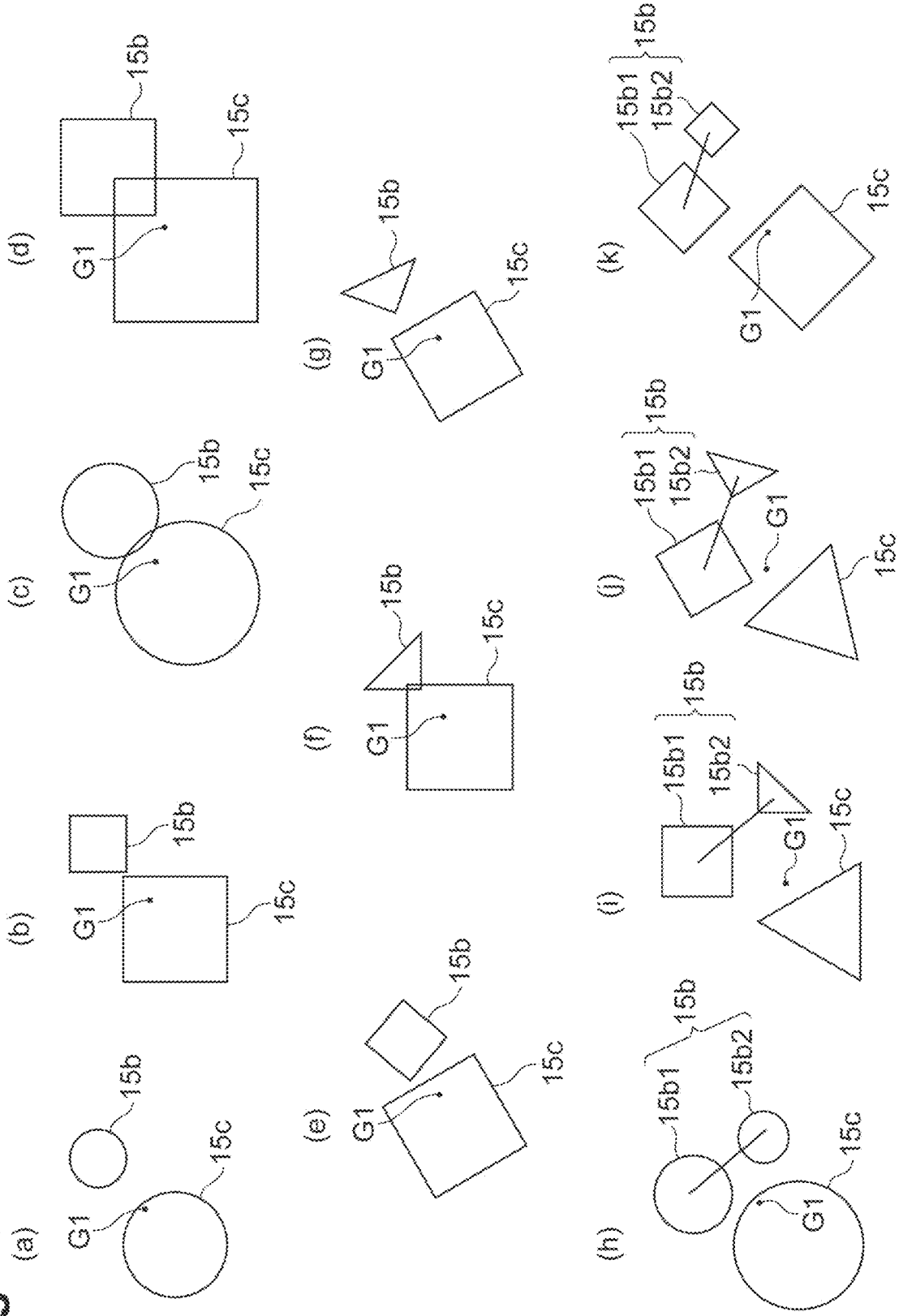
FIGS. 23A to 23K are plan views illustrating other examples of the shape of the modified refractive index element in the X-Y plane.

The planar shape of the modified refractive index element 15c is, for example, a circular shape; however, similarly to the modified refractive index element 15b, the modified refractive index element 15c can have various shapes. FIGS. 23A to 23K illustrate examples of the shapes and relative relationship of the modified refractive index elements 15b and 15c on the X-Y plane. FIGS. 23A and 23B illustrate modes in which the modified refractive index elements 15b and 15c have figures of an identical shape. FIGS. 23C and 23D illustrate modes in which the modified refractive index elements 15b and 15c have figures of an identical shape, and portions thereof overlap with each other. FIG. 23E illustrates a mode in which the modified refractive index elements 15b and 15c have figures of an identical shape and the modified refractive index elements 15b and 15c are rotated with respect to each other. FIG. 23F illustrates a mode in which the modified refractive index elements 15b and 15c have figures of different shapes. FIG. 23G illustrates a mode in which the modified refractive index elements 15b and 15c have figures of different shapes and the modified refractive index elements 15b and 15c are rotated with respect to each other.

In addition, as illustrated in FIGS. 23H to 23K, the modified refractive index element 15b may be configured to include two regions 15b1 and 15b2 which are separated from each other. Then, the distance between the center of gravity of the elements 15b1 and 15b2 (corresponding to the center of gravity of the single modified refractive index element 15b) and the center of gravity of the modified refractive index element 15c may be arbitrarily set within the unit constituent region R. In addition, in this case, as illustrated in FIG. 23H, the elements 15b1 and 15b2 and the modified refractive index element 15c may have figures having an identical shape. Alternatively, as illustrated in FIG. 23I, two of the figures of the elements 15b1 and 15b2 and the modified refractive index element 15c may be different from the other. In addition, as illustrated in FIG. 23J, in addition to the angle of the straight line connecting the elements 15b1 and 15b2 with respect to the X-axis, the angle of the modified refractive index element 15c with respect to the X-axis may be arbitrarily set within the unit constituent region R. In addition, as illustrated in FIG. 23K, while the elements 15b1 and 15b2 and the modified refractive index element 15c maintain an identical relative angle to each other, the angle of the straight line connecting the elements 15b1 and 15b2 with respect to the X-axis may be arbitrarily set in the unit constituent region R.

The modified refractive index elements may have an identical shape in the X-Y plane over the unit constituent regions R. That is, it may be possible that the modified refractive index elements have identical figures in all of the unit constituent regions R and that the unit constituent regions R overlap with each other by translation operation, or by translation operation and rotation operation. Alternatively, the shapes of the modified refractive index elements in the X-Y plane do not necessarily have to be identical between the unit constituent regions R, and may be different from each other in the adjacent unit constituent regions R The light emission device according to the present embodiment is not limited to the above embodiment, and various modifications can be made. For example, in the above embodiment, a laser element comprised of a GaAs, InP, or nitride (particularly GaN) compound semiconductors has been described as an example; however, the present embodiment can be applied to a laser element comprised of various semiconductor materials other than compound semiconductors.

In addition, in the above-described embodiment, an example in which the active layer provided on the semiconductor substrate common to the phase modulation layer functions as the light emission unit has been described; however, in the present embodiment, the light emission unit may be provided so as to be separated from the semiconductor substrate. As long as a light emission unit is a constituent that is optically coupled to a phase modulation layer and supplies light to the phase modulation layer, even with such a configuration, similar effects as those of the above-described embodiment can be suitably achieved.

REFERENCE SIGNS LIST

1A . . . Semiconductor light emitting element; 10 . . . Semiconductor substrate; 10*a* . . . Main surface; 10*b* . . . Back surface; 11, 13 . . . Cladding layer; 12 . . . Active layer; 14 . . . Contact layer; 15A, 15B . . . Phase modulation layer; 15*a* . . . Base layer; 15*b* . . . Modified refractive index element; 16, 17 . . . Electrode; 17*a* Opening; 18 . . . Protective film; 19 . . . Antireflection film; B1, B2 . . . Optical image portion; B3 . . . Zero-order light; G1, G2 . . . Center of gravity; O . . . Lattice point; PR, PL, PU, PD . . . Fundamental light wave; and R . . . Unit constituent region.

The invention claimed is:

1. A light emission device outputting light forming an optical image along a normal direction to a main surface of a substrate, an inclined direction intersecting the normal direction, or both the normal direction and the inclined direction, the light emission device comprising:

a light emission unit; and a phase modulation layer provided on the substrate and optically coupled to the light emission unit, wherein the phase modulation layer has a base layer and a plurality of modified refractive index regions each having a refractive index different from a refractive index of the base layer, in an XYZ orthogonal coordinate system defined by a Z-axis that coincides with the normal direction and an X-Y plane that coincides with one surface of the phase modulation layer including the plurality of modified refractive index regions, the X-Y plane including an X-axis and a Y-axis orthogonal to each other, where an imaginary square lattice configured of an M1 (integer of 1 or more)×N1 (integer of 1 or more) unit constituent regions each having a square shape is set on the X-Y plane and a unit constituent region R(x, y) specified by a coordinate component x (integer of 1 or more and M1 or less) in an X-axis direction and a coordinate component y (integer of 1 or more and N1 or less) in an Y-axis direction is set on the X-Y plane, in the unit constituent region R(x, y), in a state where each of centers of gravity G1 of a plurality of modified refractive index elements constituting a modified refractive index region located in the unit constituent region R(x, y) is away from a lattice point O(x, y) which is a center of the unit constituent region R(x, y), an angle formed by a first line segment that extends from a lattice point O(x, y) to a center of gravity G2 defined by the plurality of modified refractive index elements located in the unit constituent region R(x, y) as a whole and a second line segment that passes through the lattice point O(x, y) and is parallel to the X-axis direction or the Y-axis direction is set such that light that forms an optical image is outputted, a distance from the lattice point O(x, y) to each of the centers of gravity G1 of the plurality of modified refractive index elements located in the unit constituent region R(x, y) is greater than 0.30 times and is not greater than 0.50 times of lattice spacing of the imaginary square lattice, and a distance from the lattice point O(x, y) to the center of gravity G2 defined by the plurality of modified refractive index elements located in the unit constituent region R(x, y) as a whole is greater than 0 and is not greater than 0.30 times of the lattice spacing of the imaginary square lattice.

2. The light emission device according to claim 1, wherein the modified refractive index region located in the unit constituent region R(x, y) includes, as the plurality of modified refractive index elements, at least two modified refractive index elements having areas different from each other.

3. The light emission device according to claim 1, wherein respective distances from the lattice point O(x, y) to the centers of gravity G1 of the plurality of modified refractive index elements located in the unit constituent region R(x, y) are different from each other.

4. The light emission device according to claim 1, wherein the modified refractive index region located in the unit constituent region R(x, y) includes, as the plurality of modified refractive index elements, two modified refractive index elements arranged without satisfying a relationship of point symmetry with respect to the lattice point O(x, y).

5. The light emission device according to claim 1, wherein the modified refractive index region located in the unit constituent region R(x, y) includes, as the plurality of modified refractive index elements, three or more modified refractive index elements.

6. The light emission device according to claim 1, wherein the distance from the lattice point O(x, y) to each of the centers of gravity G1 of the modified refractive index elements located in the unit constituent region R(x, y) is 0.38 times of lattice spacing of the imaginary square lattice.

* * * * *